(12) United States Patent
Cheng et al.

(10) Patent No.: US 9,703,698 B2
(45) Date of Patent: Jul. 11, 2017

(54) DATA WRITING METHOD, MEMORY CONTROLLER AND MEMORY STORAGE APPARATUS

(71) Applicant: PHISON ELECTRONICS CORP., Miaoli (TW)

(72) Inventors: Kuo-Yi Cheng, Taipei (TW); Wei Lin, Taipei (TW); Kim-Hon Wong, Hsinchu County (TW); Hao-Zhi Lee, Miaoli County (TW); Hung-Chun Lin, Yilan County (TW); Chun-Yen Chang, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 231 days.

(21) Appl. No.: 13/935,572

(22) Filed: Jul. 5, 2013

(65) Prior Publication Data

US 2014/0325118 A1    Oct. 30, 2014

(30) Foreign Application Priority Data

Apr. 30, 2013  (TW) .............................. 102115469 A

(51) Int. Cl.

| | |
|---|---|
| G06F 12/00 | (2006.01) |
| G06F 12/02 | (2006.01) |
| G11C 11/56 | (2006.01) |
| G11C 29/00 | (2006.01) |
| G11C 7/04 | (2006.01) |

(52) U.S. Cl.
CPC ............ *G06F 12/0246* (2013.01); *G11C 7/04* (2013.01); *G11C 11/5628* (2013.01); *G11C 29/82* (2013.01); *G06F 2212/7202* (2013.01)

(58) Field of Classification Search
None
See application file for complete search history.

(56) References Cited

U.S. PATENT DOCUMENTS

2009/0282184 A1*  11/2009  Dutta .................. B05B 11/3098
                                                                711/103

\* cited by examiner

*Primary Examiner* — Brian Peugh
(74) *Attorney, Agent, or Firm* — Jianq Chyun IP Office

(57) ABSTRACT

A data writing method for writing data into a physical erasing unit and a memory controller and a memory storage apparatus using the data writing method are provided. The method includes dividing the data into a plurality of information frames in a unit of one physical programming unit. The method also includes writing the information frames in sequence into at least one physical programming unit constituted by memory cells disposed on at least one first word line and programming the storage state of memory cells disposed on at least one second word line following the first word line to an auxiliary pattern. Accordingly, the method effectively prevents data stored in the physical erasing unit, which is not full of data, from being lost due to a high temperature.

24 Claims, 16 Drawing Sheets

|  802 | 804 |
| --- | --- |
| logical address | physical address |
| LBA(0) | NULL |
| LBA(1) | NULL |
| LBA(2) | NULL |
| ⋮ | ⋮ |
| LBA(H) | NULL |

| lower physical programming unit | upper physical programming unit | |
| --- | --- | --- |
| PBA(0-0) | PBA(0-2) | W(0) |
| PBA(0-1) | PBA(0-4) | W(1) |
| PBA(0-3) | PBA(0-6) | W(2) |
| PBA(0-5) | PBA(0-8) | W(3) |
| ⋮ | ⋮ | ⋮ |
| PBA(0-(K-4)) | PBA(0-(K-1)) | W((L)-2) |
| PBA(0-(K-2)) | PBA(0-K) | W((L)-1) |

FIG. 15

DATA WRITING METHOD, MEMORY
CONTROLLER AND MEMORY STORAGE
APPARATUS

CROSS-REFERENCE TO RELATED
APPLICATION

This application claims the priority benefit of Taiwan application serial no. 102115469, filed on Apr. 30, 2013. The entirety of the above-mentioned patent application is hereby incorporated by reference herein and made a part of this specification.

BACKGROUND

Technology Field

The present invention relates to a data writing method for a rewritable non-volatile memory module, and a memory controller and a memory storage apparatus using the method.

Description of Related Art

Along with the widespread of digital cameras, mobile phones, and MP3 in recent years, consumers' demand for storage media has increased drastically. Because a rewritable non-volatile memory has the characteristics of non-volatility of data, low power consumption, small volume, non-mechanical structure, and fast reading and writing speed, the rewritable non-volatile memory is the most adaptable memory to be applied in a portable electronic product, e.g. a notebook computer. A solid state drive (SSD) is a storage apparatus which utilizes a flash memory as its storage medium. Therefore, the flash memory industry has become a very popular part of the electronic industry in recent years.

As semiconductor manufacturing technology advances, a flash memory module with memory cells capable of storing multiple bits of data has been developed. Specifically, to write (or to program) data to the memory cell, a voltage applied to a certain terminal in the memory cell is controlled to change the electron volume in a charge-trapping layer in the gate, for example, so that the conduction state of the channel of the memory cell is changed to present a different storage state. Take a multi-level cell (MLC) NAND flash memory as an example, when the data of the lower page is 1, and the data of the upper page is 1 as well, the control circuit controls the word line control circuit not to change the gate voltage in the memory cell, so as to keep the storage state of the memory cell as "11". When the data of the lower page is 1, and the data of the upper page is 0, the control circuit controls the word line control circuit to change the gate voltage in the memory cell, so as to change the storage state of the memory cell to "10". When the data of the lower page is 0, and the data of the upper page is 0 as well, the control circuit controls the word line control circuit to change the gate voltage in the memory cell, so as to change the storage state of the memory cell to "00". And, when the data of the lower page is 0, and the data of the upper page is 1, the control circuit controls the word line control circuit to change the gate voltage in the memory cell, so as to change the storage state of the memory cell to "01". In other words, when reading data, the control circuit recognizes the storage state of the memory cell according to the current gate voltage of the memory cell.

However, when the flash memory module is in a high temperature environment, the data stored therein may be lost due to electric leakage of the memory cell. For instance, during mass production of the electronic products (e.g. mobile phones, tablet computers, and navigators) that are provided with embedded MMC (eMMC) chips, the eMMC chips with data (e.g. firmware codes) burnt thereon are mounted to the electronic devices through a high temperature solder furnace. At high temperature, however, the data in the eMMC chip may be lost, insulting in the malfunction of the electronic devices. In particular, if a physical block is not filled with data, the memory cell, which is yet programmed, on the word line has the highest potential. As a result, the adjacent memory cells with data stored therein suffer large electric leakage at the margin under high temperature, which causes data loss from the eMMC chip.

Therefore, how to prevent data stored in the flash memory module from being lost due to high temperature is one of the issues that need to be overcome in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a data writing method, a memory controller, and a memory storage apparatus that effectively prevent data stored in a physical erasing unit, which is not full of data, from be lost due to a high temperature.

In an exemplary embodiment of the present invention, a data writing method for writing data into a physical erasing unit is provided, wherein the physical erasing unit includes a plurality of memory cells, a plurality of word lines, and a plurality of bit lines. Each of the memory cells is electrically connected to one of the word lines and one of the bit lines. The memory cells constitute a plurality of physical programming units. The physical programming units include a plurality of lower physical programming units and a plurality of upper physical programming units. A speed of writing data to the lower physical programming units is higher than a speed of writing data into the upper physical programming units. The data writing method includes dividing the data into a plurality of information frames in a unit of one physical programming unit, wherein the number of the information frames is smaller than the number of the physical programming units of the physical erasing unit. Moreover, the data writing method further includes filling the lower physical programming units with the information frames and then writing the rest of the information frames to the upper physical programming units, or programming at least one second word line adjacent to at least one first word line among the word lines to an auxiliary pattern, wherein the first word line stores at least a portion of the information frames, and the auxiliary pattern is invalid data. In the physical erasing unit, the first word line is not adjacent to a third word line, wherein the information frames in the memory cells on the third word line are in an erasing state.

In an exemplary embodiment of the present invention, a memory controller for controlling a rewritable non-volatile memory module is provided. The memory controller includes a host interface, a memory interface, and a memory management circuit. The host interface is configured to be coupled to a host system. The memory interface is configured to be coupled to the rewritable non-volatile memory module. The memory management circuit is coupled to the host interface and the memory interface. The memory management circuit is configured for writing data into a physical erasing unit of the rewritable non-volatile memory module, wherein the physical erasing unit includes a plurality of memory cells, a plurality of word lines, and a plurality of bit lines. Each of the memory cells is electrically connected to one of the word lines and one of the bit lines. The memory cells constitute a plurality of physical programming units. The physical programming units include a plurality of lower physical programming units and a plurality of upper physical programming units. A speed of writing data into the lower physical programming units is higher than a speed of writing data into the upper physical programming units. In addition, the memory management circuit divides the data into a plurality of information frames in a unit of one physical programming unit, wherein the number of the information frames is smaller than the number of the physical programming units of the physical erasing unit. Moreover, the memory management circuit fills the lower physical programming units with the information frames and then writes the rest of the information frames to the upper physical programming units, or programs at least one second word line adjacent to at least one first word line among the word lines to an auxiliary pattern, wherein the first word line stores at least a portion of the information frames, and the auxiliary pattern is invalid data. In the physical erasing unit, the first word line is not adjacent to a third word line, wherein a storage state of the memory cells on the third word line is an erasing state.

In an exemplary embodiment of the present invention, a memory storage apparatus including a connector, a rewritable non-volatile memory module, and a memory controller is provided. The connector is configured to be coupled to a host system. The memory controller is coupled to the connector and the rewritable non-volatile memory module and is configured for writing data into the physical erasing unit of the rewritable non-volatile memory module, wherein the physical erasing unit includes a plurality of memory cells, a plurality of word lines, and a plurality of bit lines. Each of the memory cells is electrically connected to one of the word lines and one of the bit lines. The memory cells constitute a plurality of physical programming units. The physical programming units include a plurality of lower physical programming units and a plurality of upper physical programming units. A speed of writing data into the lower physical programming units is higher than a speed of writing data into the upper physical programming units. In addition, the memory controller divides the data into a plurality of information frames in a unit of one physical programming unit, wherein the number of the information frames is smaller than the number of the physical programming units of the physical erasing unit. Moreover, the memory controller fills the lower physical programming units with the information frames and then writes the rest of the information frames to the upper physical programming units, or programs at least one second word line adjacent to at least one first word line among the word lines to an auxiliary pattern, wherein the first word line stores at least a portion of the information frames, and the auxiliary pattern is invalid data. In the physical erasing unit, the first word line is not adjacent to a third word line, wherein a storage state of the memory cells on the third word line is an erasing state.

In an exemplary embodiment of the present invention, a memory storage apparatus including a connector, a rewritable non-volatile memory module, and a memory controller is provided. The connector is configured to be coupled to a host system. The rewritable non-volatile memory module includes a plurality of physical erasing units, wherein each of the physical erasing units includes a plurality of memory cells, a plurality of word lines, and a plurality of bit lines. Each of the memory cells is electrically connected to one of the word lines and one of the bit lines. The memory cells constitute a plurality of physical programming units. The memory controller is coupled to the connector and the rewritable non-volatile memory module. Herein, one of the word lines of one physical erasing unit among the physical erasing units stores invalid data. The invalid data is the same as the valid data on another word line adjacent to said one word line, or the invalid data is in a non-erasing state.

Based on the above, the data writing method, memory controller, and memory storage apparatus in the exemplary embodiment effectively prevent data loss that may occur to the physical erasing unit, which is not full of data, before leaving the factory (before being processed by a solder furnace) or when used by the user.

In order to make the aforementioned features and advantages of the present invention more comprehensible, embodiments accompanying figures are described in detail below.

It should be understood, however, that this Summary may not contain all of the aspects and embodiments of the present invention, is not meant to be limiting or restrictive in any manner, and that the present invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

FIG. 14 illustrates an example of a logical address to physical programming unit mapping table according to an exemplary embodiment of the invention.

FIG. 15 is a schematic diagram illustrating a physical programming unit according to an exemplary embodiment.

DESCRIPTION OF EMBODIMENTS

Figure 1:
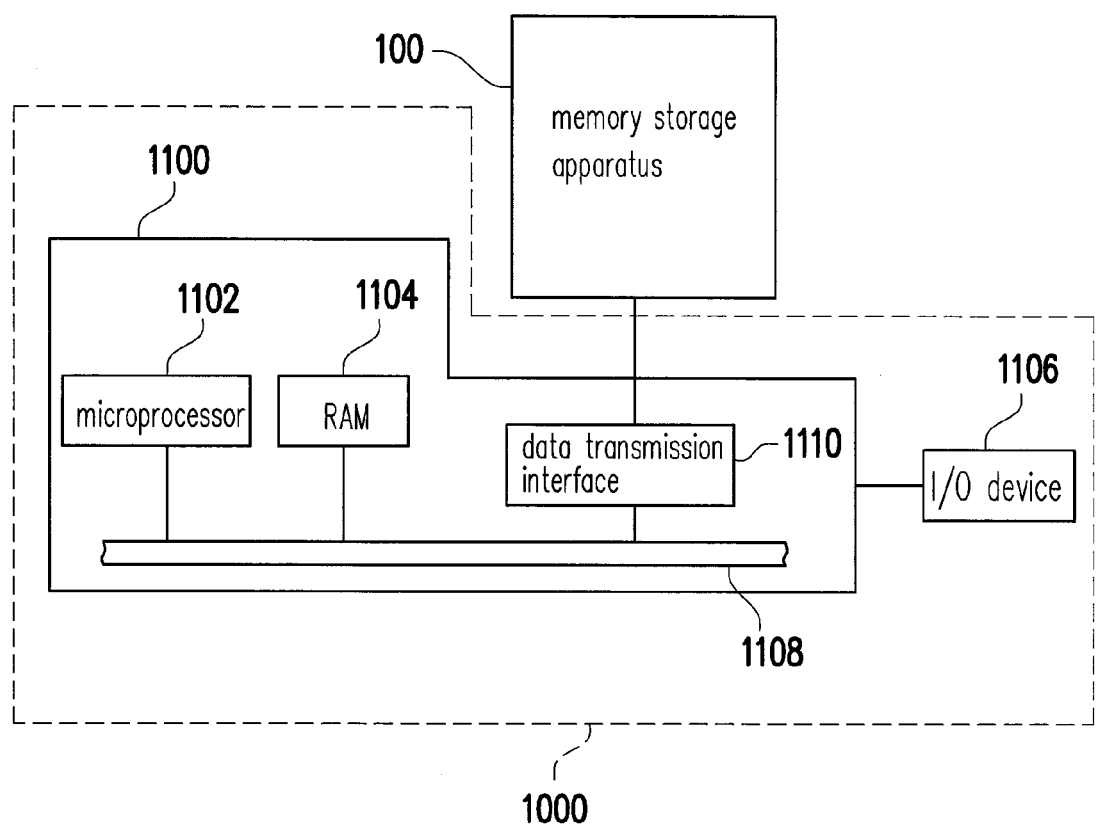
FIG. 1 illustrates a host system and a memory storage apparatus according to the first exemplary embodiment.

Reference will now be made in detail to the present exemplary embodiments of the present invention, examples of which are illustrated in the accompanying drawings. Wherever possible, the same reference numbers are used in the drawings and the description to refer to the same or like parts. Embodiments of the present invention may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more," and "at least one" can be used interchangeably herein.

First Exemplary Embodiment

Generally speaking, a memory storage apparatus (also called memory storage system) includes a rewritable non-volatile memory module and a controller (also called a control circuit). The memory storage apparatus is usually used together with a host system, such that the host system can write data into or read data from the memory storage apparatus.

FIG. 1 illustrates a host system and a memory storage apparatus according to the first exemplary embodiment.

Figure 2:
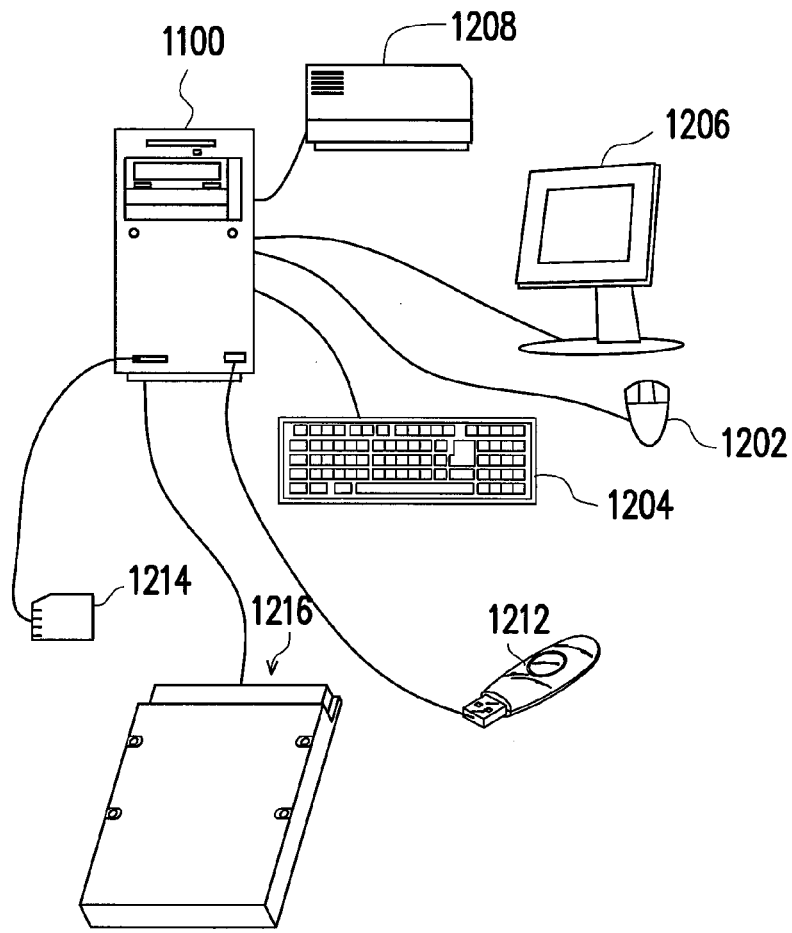
FIG. 2 is a schematic diagram illustrating a computer, an input/output device, and a memory storage apparatus according to an exemplary embodiment.

Referring to FIG. 1, generally a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1252, as shown in FIG. 2. It should be understood that the devices illustrated in FIG. 2 are not intended to limit the I/O device 1106, and the I/O device 1106 may further include other devices.

In an embodiment of the invention, the memory storage apparatus 100 is coupled to other elements of the host system 1000 through the data transmission interface 1110. Through operations of the microprocessor 1102, the random access memory 1104 and the I/O device 1106, data can be written into or read from the memory storage apparatus 100. For instance, the memory storage apparatus 100 may be a rewritable non-volatile memory storage apparatus, such as a flash drive 1256, a memory card 1214, or a solid state drive (SSD) 1216, as shown in FIG. 2.

Figure 3:
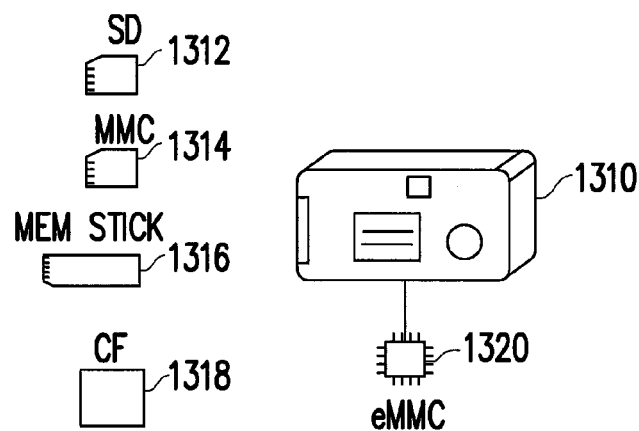
FIG. 3 is a schematic diagram illustrating a host system and a memory storage apparatus according to an exemplary embodiment.

Generally speaking, the host system 1000 can be any system substantially collocated with the memory storage apparatus 100 for storing data. Even though the host system 1000 is exemplified as a computer system in this exemplary embodiment, in another exemplary embodiment of the invention, the host system 1000 may be a system, such as digital camera, a video camera, a telecommunication device, an audio player, or a video player, etc. For example, if the host system is a digital camera (video camera) 1310, the rewritable non-volatile memory storage apparatus is then a secure digital (SD) card 1312, a multi media card (MMC) 1314, a memory stick 1316, a compact flash (CF) card 1318, or an embedded storage apparatus 1320 (as shown in FIG. 3). The embedded storage apparatus 1320 includes an embedded MMC (eMMC). It should be noted that the eMMC is directly coupled onto a substrate of the host system.

Figure 4:
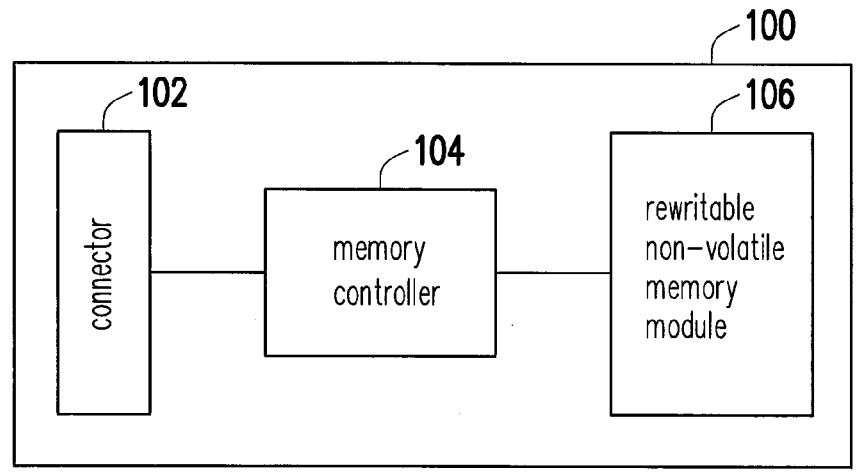
FIG. 4 is a schematic block diagram illustrating the memory storage apparatus shown in FIG. 1.

FIG. 4 is a schematic block diagram illustrating the memory storage apparatus shown in FIG. 1.

Referring to FIG. 4, the memory storage apparatus 100 includes a connector 102, a memory controller 104, and a rewritable non-volatile memory module 106.

In this exemplary embodiment, the connector 102 is compliant with the Serial Advanced Technology Attachment (SATA) standard. However, it should be understood that the invention is not limited thereto, and the connector 102 may also complies with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the Secure Digital (SD) interface standard, the Ultra High Speed-I (UHS-I) interface standard, the Ultra High Speed-II (UHS-II) interface standard, the Memory Stick (MS) interface standard, the Multi Media Card (MMC) interface standard, the Embedded Multimedia Card (eMMC) interface standard, the Universal Flash Storage (UFS) interface standard, the Compact Flash (CF) interface standard, the Integrated Device Electronics (IDE) standard, or other suitable standards.

The memory controller 104 is configured to execute a plurality of logic gates or control instructions implemented in a hardware form or in a firmware form, and performing various operations, such as data writing, data reading, or data erasing, in the rewritable non-volatile memory module 106 according to the commands of the host system 1000.

The rewritable non-volatile memory module 106 is coupled to the memory controller 104 and configured to store data written by the host system 1000. In this exemplary embodiment, the rewritable non-volatile memory module 106 is a Multi Level Cell (MLC) NAND flash memory module (i.e. a memory cell can store 2 bits of data). Nevertheless, the invention is not limited thereto. The rewritable non-volatile memory module 106 may be a Trinary Level Cell (TLC) NAND flash memory module (i.e. a memory cell can store 3 bits of data), other flash memory modules, or a memory module having the same characteristics.

Figure 5:
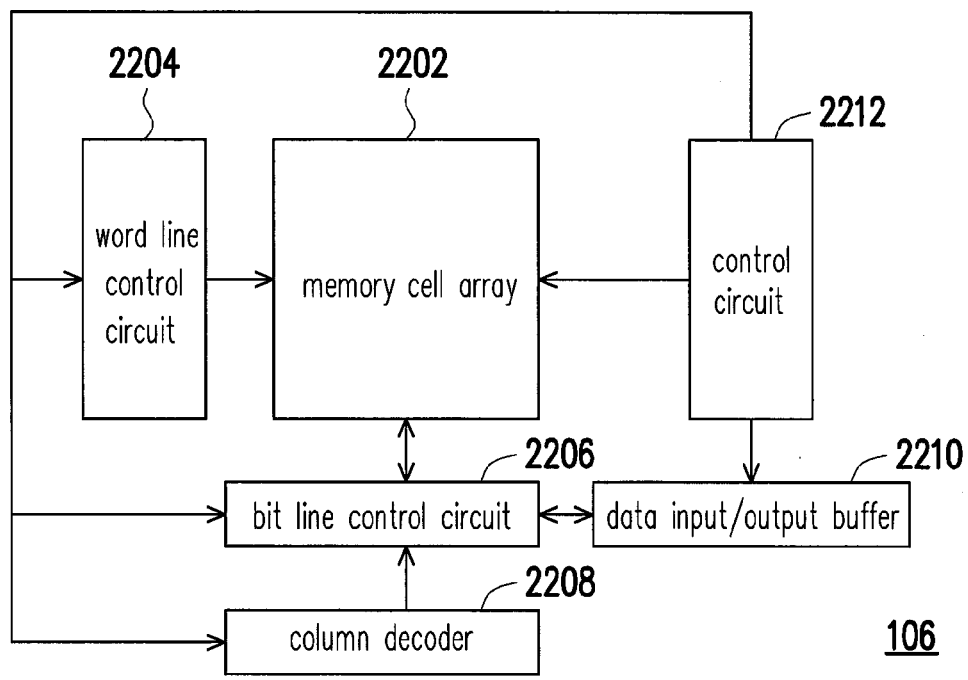
FIG. 5 is a schematic block diagram illustrating a rewritable non-volatile memory module according to an exemplary embodiment.

FIG. 5 is a schematic block diagram illustrating a rewritable non-volatile memory module according to an exemplary embodiment.

Referring to FIG. 5, the rewritable non-volatile memory module 106 includes a memory cell array 2202, a word line control circuit 2204, a bit line control circuit 2206, a column decoder 2208, a data input/output (I/O) buffer 2210, and a control circuit 2212.

Figure 6:
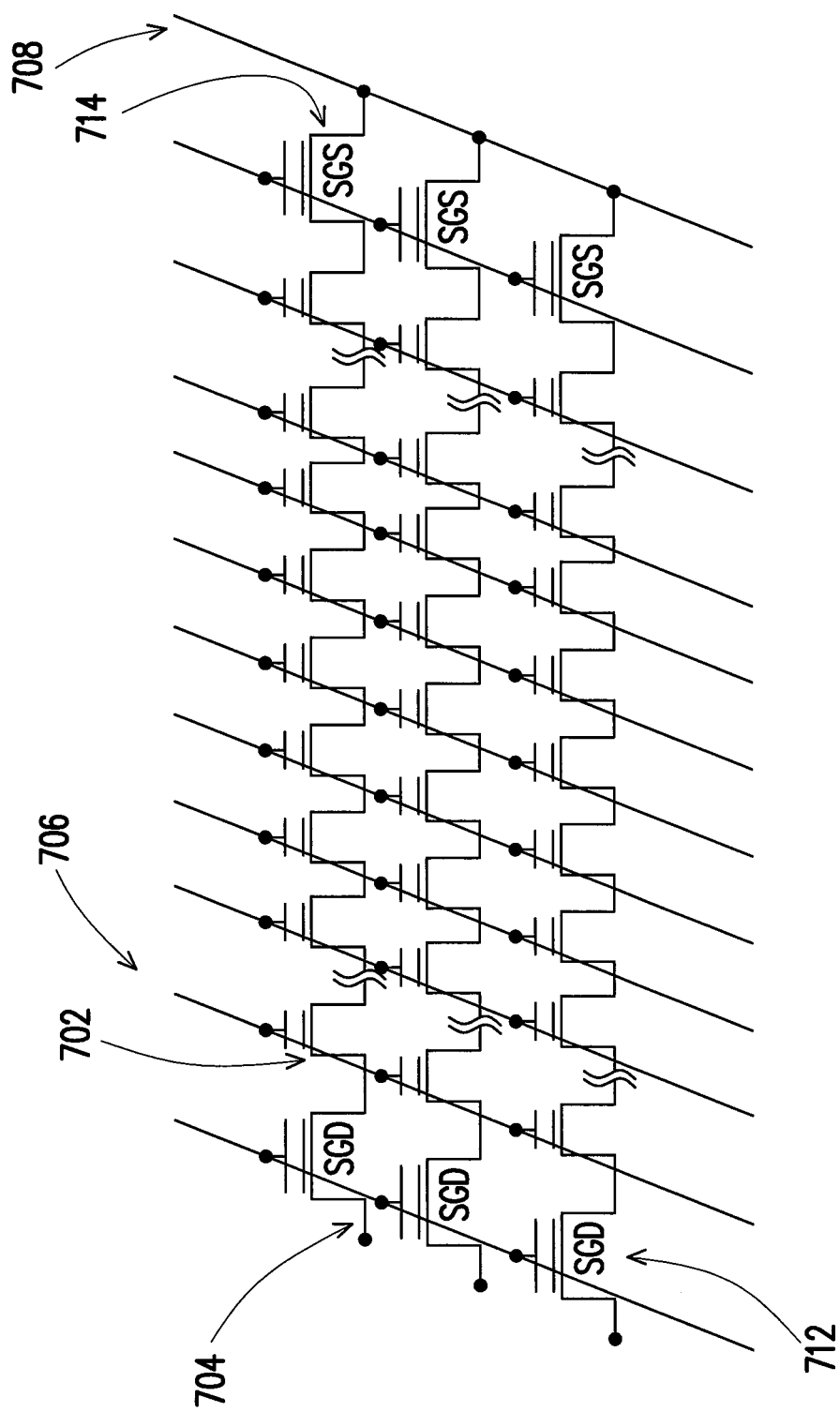
FIG. 6 is a schematic diagram illustrating a memory cell array according to an exemplary embodiment.

The memory cell array 2202 includes a plurality of memory cells 702 for storing data, a plurality of select gate drain (SGD) transistors 712, a plurality of select gate source (SGS) transistors 714, a plurality of bit lines 704 for connecting the memory cells, a plurality of word lines 706, and a common source line 708 (as shown in FIG. 6). The memory cells 702 are disposed on cross points of the bit lines 704 and the word lines 706 as an array. When a write command or a read command is received from the memory controller 104, the control circuit 2212 controls the word line control circuit 2204, the bit line control circuit 2206, the column decoder 2208, and the data I/O buffer 2210 to write data into the memory cell array 2202 or read data from the memory cell array 2202, wherein the word line control circuit 2204 is configured to control the bias voltage applied to the word lines 706, the bit line control circuit 2206 is configured to control the bias voltage applied to the bit lines 704, the column decoder 2208 selects the corresponding bit line according to a decoding column address in the command, and the data I/O buffer 2210 is configured to store the data temporarily.

In this exemplary embodiment, the rewritable non-volatile memory module 106 is an MLC NAND flash memory module which employs a plurality of gate voltages for representing a multi-bit data. To be specific, each memory cell of the memory cell array 2202 has a plurality of states, and the states are distinguished by a plurality of threshold bias voltages.

Figure 7:
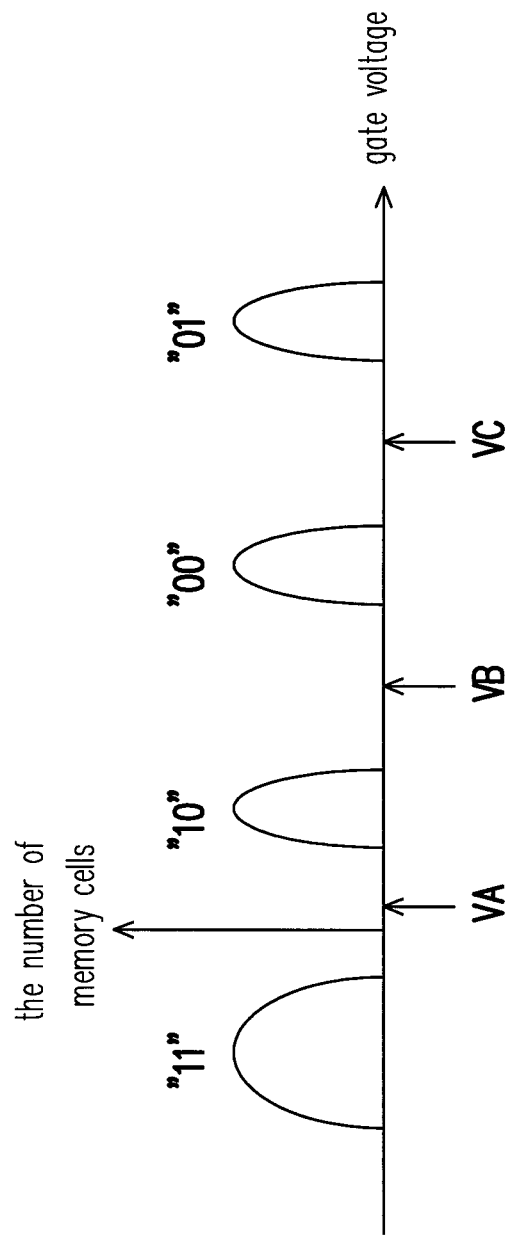
FIG. 7 is a statistical distribution diagram illustrating gate voltages corresponding to written data stored in a memory cell array according to an exemplary embodiment.

FIG. 7 is a statistical distribution diagram illustrating gate voltages corresponding to written data stored in a memory cell array according to an exemplary embodiment.

Figure 8:
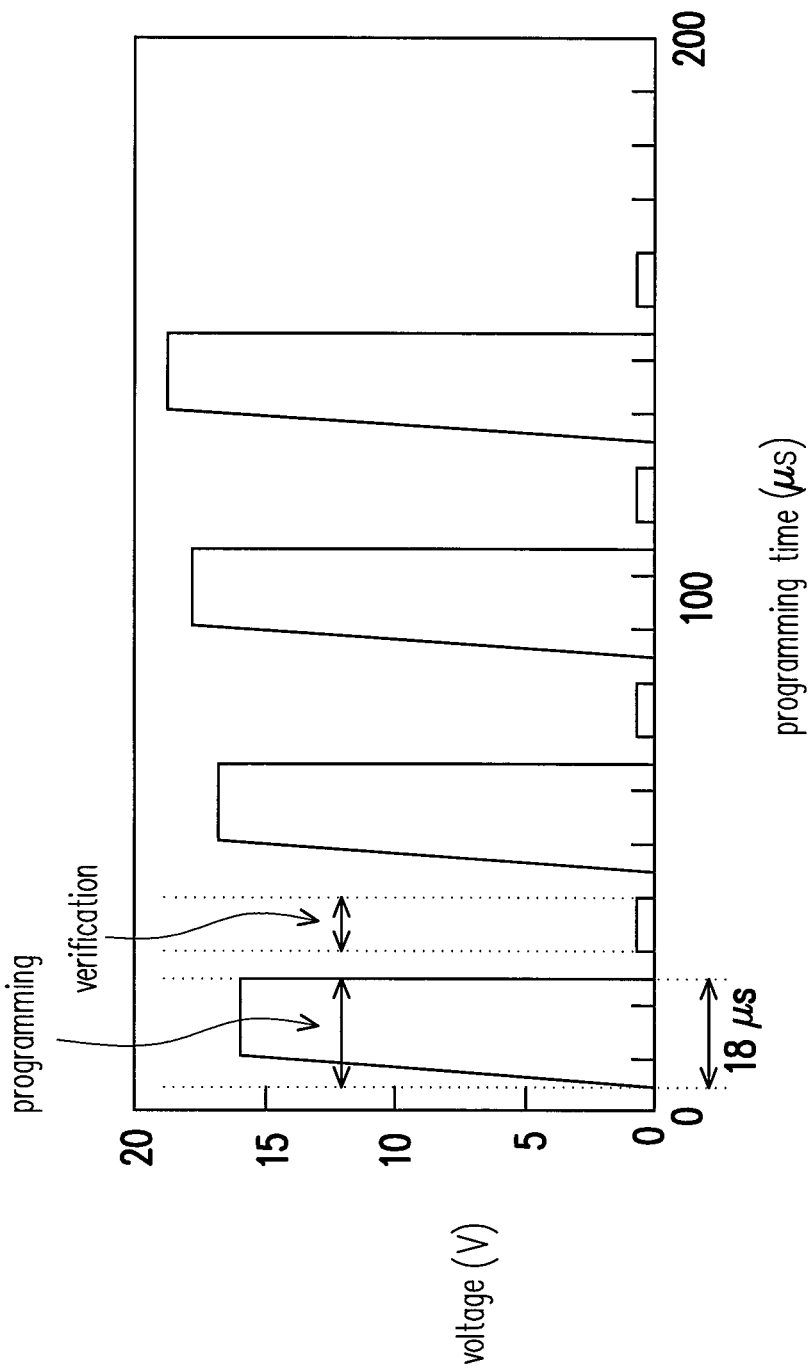
FIG. 8 is a schematic diagram of programming a memory cell according to an exemplary embodiment.

With reference to FIG. 7, in an exemplary MLC NAND flash memory, the gate voltages in each memory cell may be categorized into 4 storage states according to a first threshold bias voltage VA, a second threshold bias voltage VB, and a third threshold bias voltage VC, and these storage states respectively represent "11", "10", "00", and "01". In other words, each storage state includes the least significant bit (LSB) and the most significant bit (MSB). In this exemplary embodiment, the first bit from the left of the storage state (i.e. "11", "10", "00", and "01") is the LSB, and the second bit from the left of the storage states is the MSB. Therefore, in the first exemplary embodiment, each memory cell stores 2 bits of data. It should be understood that the gate voltages and the corresponding storage states illustrated in FIG. 8 are only examples. In another exemplary embodiment of the invention, the gate voltages and the corresponding storage states may also have such an arrangement as "11", "10", "01", and "00" along with the increase in the gate voltages. Alternatively, the storage states corresponding to the gate voltages may also be values obtained by mapping or inverting actual storage values. Besides, in yet another exemplary embodiment, the first bit from the left may be defined as the MSB, and the second bit from the left may be defined as the LSB.

In this exemplary embodiment, each memory cell stores 2 bits of data; hence, the memory cells on the same word line constitute a storage space of 2 physical programming units (i.e. a lower physical programming unit and an upper physical programming unit). Namely, the LSB of each memory cell corresponds to the lower physical programming unit, and the MSB of each memory cell corresponds to the upper physical programming unit.

FIG. 8 is a schematic diagram of programming a memory cell according to an exemplary embodiment.

With reference to FIG. 8, in this exemplary embodiment, the memory cell is programmed through applying a pulse writing/threshold bias voltage verifying method. Specifically, when data are to be written into the memory cell, the memory controller 104 determines an initial writing bias voltage and a writing bias voltage pulse time and instructs the control circuit 2212 of the rewritable non-volatile memory module 106 to program the memory cell according to the determined initial writing bias voltage and the determined writing bias voltage pulse time, thereby writing the data into the memory cell. The memory controller 104 then verifies the memory cell by means of a verification bias voltage, so as to determine whether the memory cell is in the correct storage state. If the memory cell is not programmed to be in the correct storage state, the memory controller 104 instructs the control circuit 2212 to re-program the memory cell according to the determined writing bias voltage pulse time and a new writing bias voltage (also referred to as a repetitive writing bias voltage) obtained by adding an incremental-step-pulse programming (ISPP) adjustment value to the initial writing bias voltage. By contrast, if the programmed memory cell is in the correct storage state, it indicates that the data are correctly written into the memory cell. For instance, the initial writing bias voltage is set as 16 voltages (V), the writing bias voltage pulse time is set as 18 microseconds (μs), and the ISPP adjustment value is set as 0.6 V; however, the invention is not limited thereto. Herein, the verification bias voltage of the first storage state "11" is lower than the verification bias voltage of the second storage state "10"; the verification bias voltage of the second storage state "10" is lower than the verification bias voltage of the third storage state "00"; and the verification bias voltage of the third storage state "00" is lower than the verification bias voltage of the fourth storage state "01".

Figure 9:
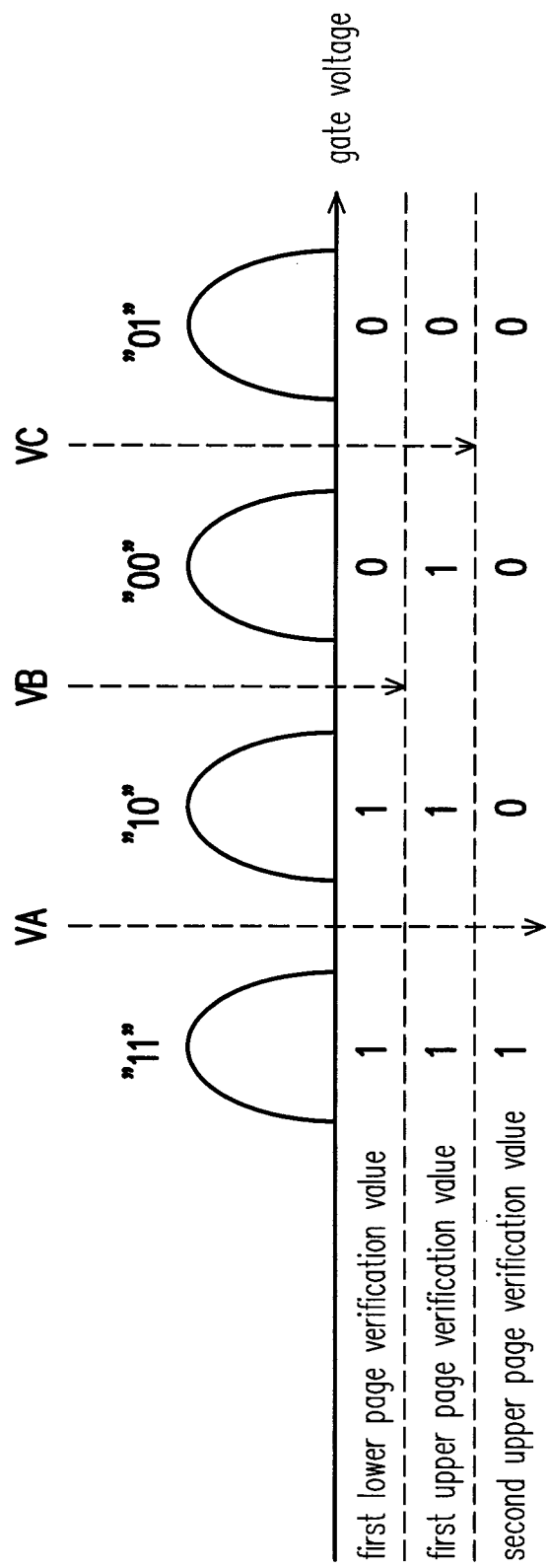
FIG. 9 is a schematic diagram illustrating reading data from a memory cell according to an exemplary embodiment.

FIG. 9 is a schematic diagram illustrating reading data from a memory cell according to an exemplary embodiment.

With reference to FIG. 9, in order to read data from a memory cell of the memory cell array 2202, a reading bias voltage is applied to a control gate; and by means of the conduction state of the channel of the memory cell, the data stored in the memory cell may be indicated. Here, the channel of the memory cell refers to an electrical connection path between the bit lines and the source lines of the memory cell (e.g. the path between the source and the drain of the memory cell). In an operation for reading data from a lower page, the word line control circuit 2204 applies the second threshold bias voltage VB (as the reading bias voltage) to the memory cell and determines the value of data of the lower page according to whether the channel of the memory cell is conducted and the corresponding expression (1):

$$\text{LSB}=(VB)\text{Lower\_pre1} \tag{1}$$

In the expression (1), (VB)Lower_pre1 represents a first lower page verification value obtained by applying the second threshold bias voltage VB.

For instance, when the second threshold bias voltage VB is lower than the gate voltage in the memory cell, the channel of the memory cell is not conducted, and a first lower page verification value, which is '0', is output. Accordingly, the LSB is indicated to be in a first state as 0. For example, when the second threshold bias voltage VB is higher than the gate voltage in the memory cell, the channel of the memory cell is conducted, and the first lower page verification value, which is '1', is output. Accordingly, the LSB is indicated as being in a second state. Here, the first state is indicated as "0," and the second state is indicated as "1". That is, the gate voltage for presenting the LSB as "1" and the gate voltage for presenting the LSB as "0" may be distinguished by the second threshold bias voltage VB.

In an operation for reading data from an upper page, the word line control circuit 2204 respectively applies the third threshold bias voltage VC and the first threshold bias voltage VA (collectively as the reading bias voltage) to the memory cell and determines the value of data of the upper page according to whether the channel of the memory cell is conducted and the corresponding expression (2):

$$\text{MSB}=((VA)\text{Upper\_pre2}) \text{xor}(\sim(VC)\text{Upper\_pre1}) \quad (2)$$

In the expression (2), (VC)Upper_pre1 represents a first upper page verification value obtained by applying the third threshold bias voltage VC, and (VA)Upper_pre2 represents a second upper page verification value obtained by applying the first threshold bias voltage VA, wherein the symbol "~" represents inversion. Additionally, in this exemplary embodiment, when the third threshold bias voltage VC is lower than the gate voltage in the memory cell, the channel of the memory cell is not conducted, and the first upper page verification value ((VC)Upper_pre1), which is '0', is output; when the first threshold bias voltage VA is lower than the gate voltage in the memory cell, the channel of the memory cell is not conducted, and the second upper page verification value ((VA)Upper_pre2), which is '0', is output.

Thus, in this exemplary embodiment, according to the expression (2), it is assumed that the third threshold bias voltage VC and the first threshold bias voltage VA are both lower than the gate voltage in the memory cell. When the third threshold bias voltage VC is applied, the channel of the memory cell is not conducted, and a first upper page verification value, which is '0', is output; when the first threshold bias voltage VA is applied, the channel of the memory cell is not conducted, and a second upper page verification value, which is '0', is output. At this time, the MSB is indicated as being in the second state, i.e. "1".

For instance, it is assumed that the third threshold bias voltage VC is higher than the gate voltage of the memory cell, and the first threshold bias voltage VA is lower than the gate voltage of the memory cell. When the third threshold bias voltage VC is applied, the channel of the memory cell is conducted, and a first upper page verification value, which is '1', is output; when the first threshold bias voltage VA is applied, the channel of the memory cell is not conducted, and a second upper page verification value, which is '0', is output. At this time, the MSB is indicated as being in a first state, i.e., "0".

For instance, it is assumed that the third threshold bias voltage VC and the first threshold bias voltage VA are both higher than the gate voltage of the memory cell. When the third threshold bias voltage VC is applied, the channel of the memory cell is conducted, and a first upper page verification value, which is '1', is output; when the first threshold bias voltage VA is applied, the channel of the memory cell is conducted, and a second upper page verification value, which is '1', is output. At this time, the MSB is indicated as being in the second state, i.e., "1".

Based on the above, in the reading operation of the MLC NAND flash memory, the storage state of each memory cell can be distinguished into the first storage state "11," the second storage state "10," the third storage state "00," and the fourth storage state "01," by means of the first threshold bias voltage VA, the second threshold bias voltage VB, and the third threshold bias voltage VC, along with the increase of the gate voltage.

It should be understood that the exemplary MLC NAND flash memory described herein should not be construed as limitation to the invention. And, data can be read from any other MLC NAND flash memory through the principle described above.

Figure 10:
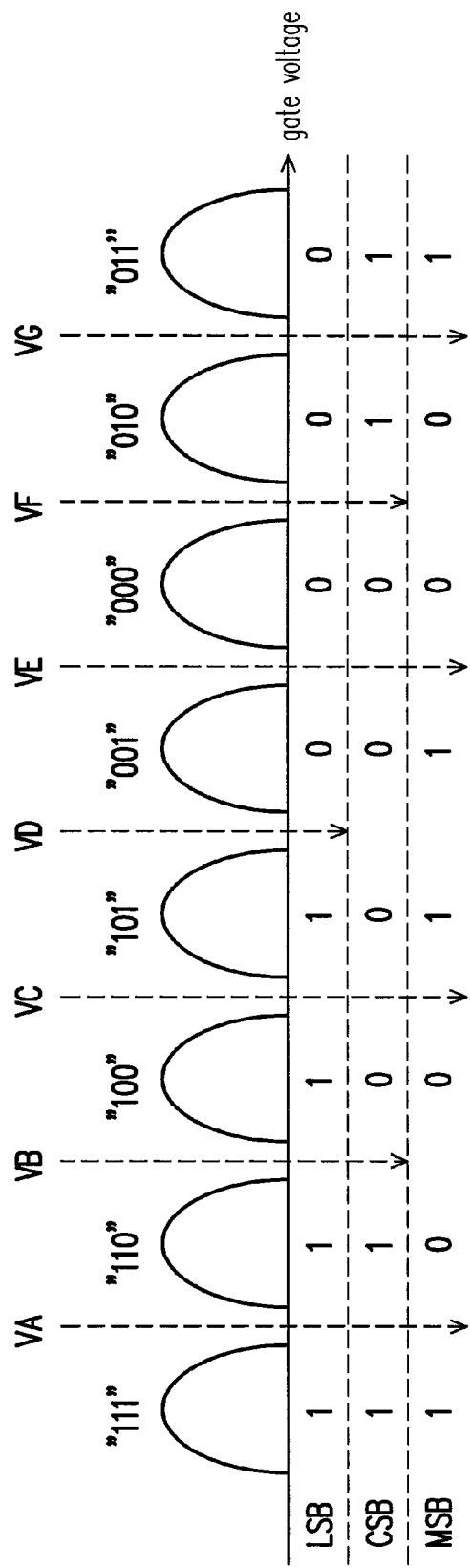
FIG. 10 is a schematic diagram illustrating reading data from a memory cell according to another exemplary embodiment.

For instance, in an exemplary TLC NAND flash memory (as shown in FIG. 10), each storage state includes an LSB (the first bit from the left), a center significant bit (CSB, the second bit from the left), and an MSB (the third bit from the left), wherein the LSB corresponds to a lower page, the CSB corresponds to a center page, and the MSB corresponds to an upper page. In this example, the gate voltage in each memory cell is distinguished into 8 storage states (i.e. a first storage state "111", a second storage state "110", a third storage state "100", a fourth storage state "101", a fifth storage state "001", a sixth storage state "000", a seventh storage state "010", and an eighth storage state "011") according to a first threshold bias voltage VA, a second threshold bias voltage VB, a third threshold bias voltage VC, a fourth threshold bias voltage VD, a fifth threshold bias voltage VE, a sixth threshold bias voltage VF, and a seventh threshold bias voltage VG.

Figure 11:
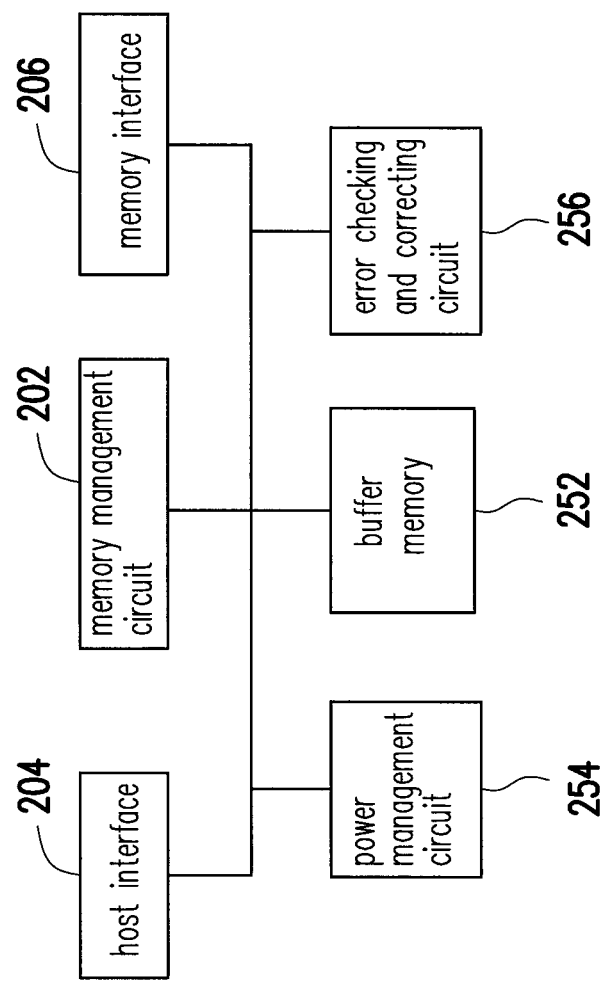
FIG. 11 is a schematic block diagram illustrating a memory controller according to an exemplary embodiment.

FIG. 11 is a schematic block diagram illustrating a memory controller according to an exemplary embodiment. It should be understood that the memory controller illustrated in the FIG. 5 is merely an example, and the invention is not limited thereto.

With reference to FIG. 11, the memory controller 104 includes a memory management circuit 202, a host interface 204, and a memory interface 206.

The memory management circuit 202 is configured to control the whole operation of the memory controller 104. Particularly, the memory management circuit 202 has a plurality of control instructions; when the memory storage apparatus 100 is operated, the control instructions are executed to perform a data writing operation, a data reading operation, a data erasing operation, and so on.

In this exemplary embodiment, the control instructions of the memory management circuit 202 are implemented in a firmware form. For example, the memory management circuit 202 includes a microprocessor unit (not shown) and a read-only memory (ROM, not shown), wherein the control instructions are burnt into the read-only memory. When the memory storage apparatus 100 is operated, the control instructions are executed by the microprocessor unit to perform operations such as data writing, reading, and erasing.

In another exemplary embodiment of the present invention, the control instructions of the memory management circuit 202 may also be stored in a specific block (for example, a system block in a memory module exclusively used for storing system data) of the rewritable non-volatile memory module 106 as a programming code. Moreover, the memory management circuit 202 includes a microprocessor unit (not shown), a read-only memory (ROM, not shown), and a random access memory (not shown). In particular, the ROM has a boot code, and when the memory controller 104 is enabled, the microprocessor unit first executes the boot code to load the control instructions from the rewritable non-volatile memory module 106 into the RAM of the memory management circuit 202. The microprocessor unit then executes the control instructions to write, read, and erase data.

Furthermore, as in another exemplary embodiment of the present invention, the control instructions in the memory management circuit 202 are implemented in a hardware form. For example, the memory management circuit 202 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit, and the data processing circuit are coupled to the micro controller. The memory cell management circuit is configured to manage physical erasing units of the rewritable non-volatile memory module 106. The memory writing circuit is configured to issue a write command to the rewritable non-volatile memory module 106 for writing data thereto. The memory reading circuit is configured to issue a read command to the rewritable non-volatile memory module 106 for reading data therefrom. The memory erasing circuit is configured to issue an erase command to the rewritable non-volatile memory module 106 for erasing data therefrom. The data processing circuit is configured to process data to be written to the rewritable non-volatile memory module 106 or data read from the rewritable non-volatile memory module 106.

The host interface 204 is coupled to the memory management circuit 202 and configured to receive and identify the commands and data transmitted by the host system 1000. That is, the commands and data transmitted by the host system 1000 are passed to the memory management circuit 202 through the host interface 204. In this exemplary embodiment, the host interface 204 complies with the SATA standard. However, it should be understood that the invention is not limited thereto, and the host interface 204 may comply with the PATA standard, the IEEE 1394 standard, the PCI express standard, the USB standard, the SD standard, the UHS-I interface standard, the UHS-II interface standard, the MS standard, the MMC standard, the eMMC interface standard, the UFS interface standard, the CF standard, the IDE standard, or other suitable data transmission standards.

The memory interface 206 is coupled to the memory management circuit 202 for accessing the rewritable non-volatile memory module 106. In other words, the data to be written into the rewritable non-volatile memory module 106 is converted to an acceptable format for the rewritable non-volatile memory module 106 by the memory interface 206.

In an exemplary embodiment of the present invention, the memory controller 104 further includes a buffer memory 252, a power management circuit 254, and an error checking and correcting (ECC) circuit 256.

The buffer memory 252 is coupled to the memory management circuit 202 and configured to temporarily store the data and commands from the host system 1000 or the data from the rewritable non-volatile memory module 106.

The power management circuit 254 is coupled to the memory management circuit 202 and configured to control the power of the memory storage apparatus 100.

The error checking and correcting circuit 256 is coupled to the memory management circuit 202 and configured to perform an error checking and correcting procedure to assure the accuracy of data. To be specific, when the memory management circuit 202 receives a write command from the host system 1000, the ECC circuit 256 generates an ECC code for data corresponding to the write command, and the memory management circuit 202 writes the data corresponding to the write command and the corresponding ECC code into the rewritable non-volatile memory module 106. Thereafter, when reading the data from the rewritable non-volatile memory module 106, the memory management circuit 202 simultaneously reads the corresponding ECC code, and the ECC circuit 256 executes the ECC procedure on the read data according to the corresponding ECC code.

Figure 12:
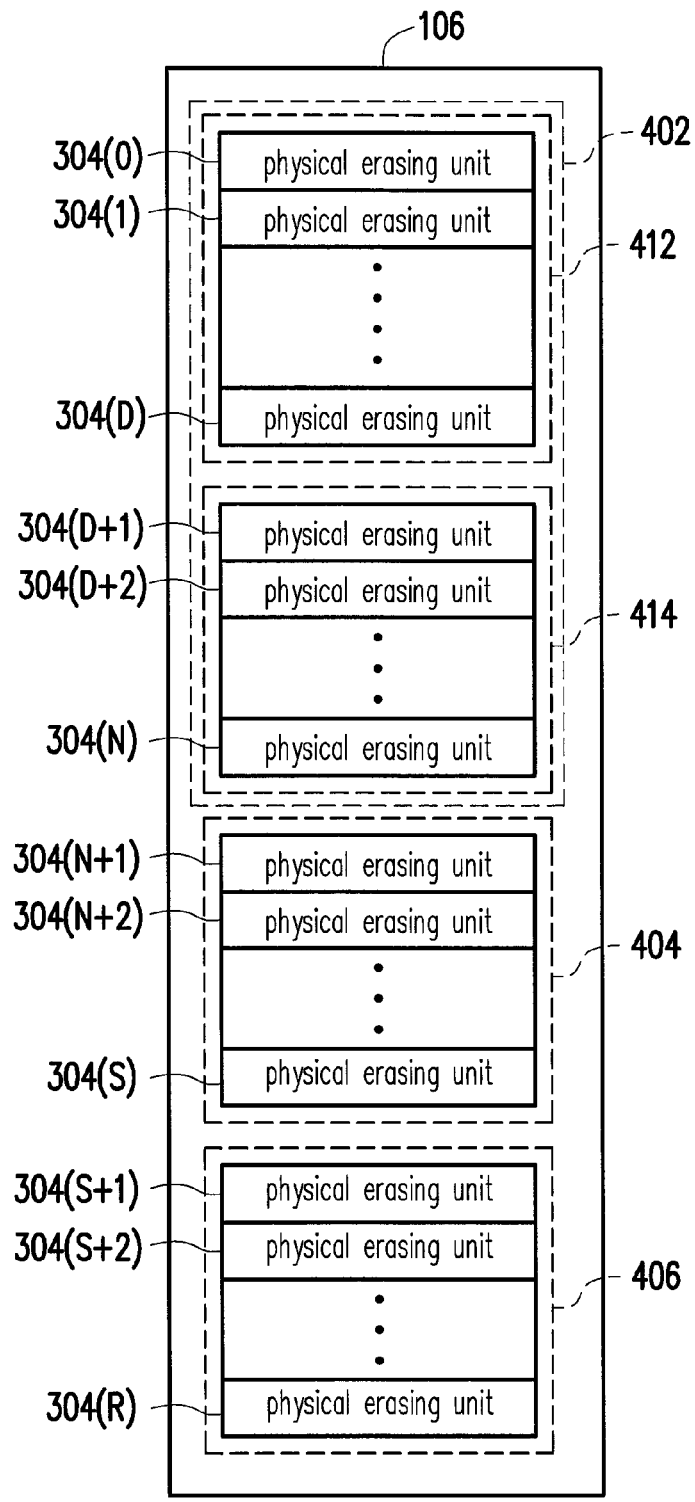
FIGS. 12 and 13 are schematic diagrams illustrating managing a rewritable non-volatile memory module according to an exemplary embodiment.
Figure 13:
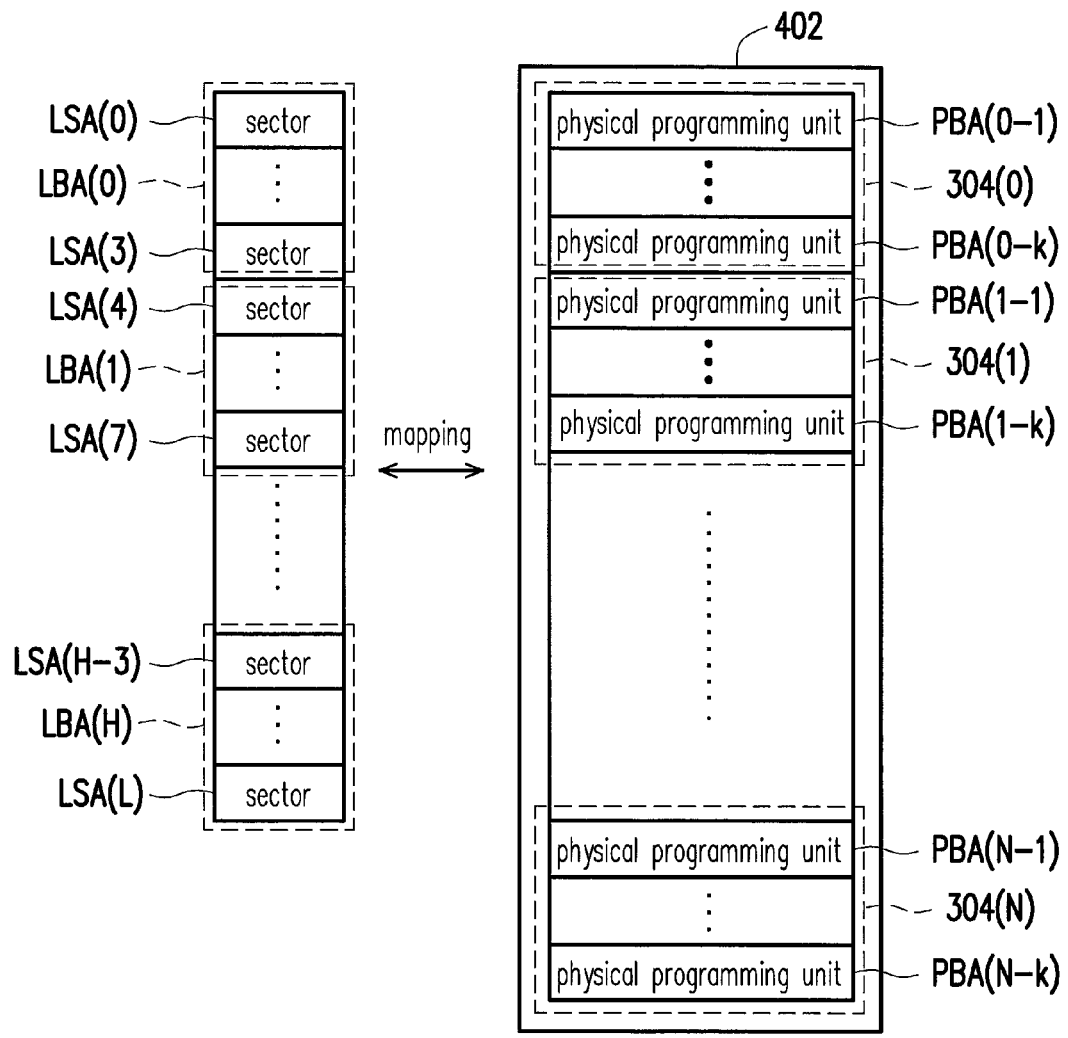

FIGS. 12 and 13 are schematic diagrams illustrating managing a rewritable non-volatile memory module according to an exemplary embodiment.

It should be understood that terms, such as "get", "select", "exchange", "group", "alternate" and so forth, are logical concepts which describe operations in the physical erase units of the rewritable non-volatile memory module 106. That is, the physical erase units of the rewritable non-volatile memory module are logically operated, but actual positions of the physical units of the rewritable non-volatile memory module are not changed.

With reference to FIG. 12, the memory controller 104 (or the memory management circuit 202) writes data into the memory cells 702 of the rewritable non-volatile memory module 106 in units of each physical programming unit and erases data from the memory cells 702 of the rewritable non-volatile memory module 106 in units of each physical erasing unit. Particularly, the memory cells 702 in the rewritable non-volatile memory module 106 constitute a plurality of physical programming units PBA(0-1)-PBA(N-K), and the physical programming units constitute a plurality of physical erasing units 304(0)-304(R). Each physical erasing unit is the smallest erasing unit. Namely, each physical erasing unit contains the least number of memory cells which are erased all together. Each physical programming unit is the smallest unit for programming data. Namely, each physical programming unit is the smallest unit for writing data. Each physical programming unit usually includes a data bit area and a redundant bit area. The data bit area includes a plurality of physical access addresses for storing user data, and the redundant bit area is used for storing system data (e.g. error checking and correcting (ECC) codes). In this exemplary embodiment, the LSBs of the memory cells on the same word line constitute a lower physical programming unit; and the MSBs of the memory cells on the same word line constitute an upper physical programming unit, wherein a speed of writing data into the lower physical programming unit is higher than a speed of writing data into the upper physical programming unit. In this exemplary embodiment, the memory controller 104 (or the memory management circuit 202) logically groups the physical erasing units 304(0)-304(R) of the rewritable non-volatile memory module 106 into a storage area 402, a system area 404, and a substitute area 406.

Logically, the physical erasing units belonging to the storage area 402 are used for storing the data written by the host system 1000. Namely, the memory storage apparatus 100 uses the physical erasing units grouped into the storage area 402 to actually store the data written by the host system 1000. In particular, the memory controller 104 (or the memory management circuit 202) groups the storage area 402 into a data area 412 and a spare area 414, wherein the physical erasing units of the data area 412 (also referred to as data physical erasing units) are physical erasing units that already have data stored therein, and the physical erasing units of the spare area 414 (also referred to as spare physical erasing units) are provided for substituting the physical erasing units of the data area 412. Hence, the physical erasing units of the spare area 414 are empty or usable physical erasing units, which record no data or record invalid data marked as useless. In other words, the data in the physical erasing units of the spare area 414 has been erased therefrom, or will be erased before the physical erasing units of the spare area 414 are extracted for storing other data. Hence, the physical erasing units of the spare area 414 are usable physical erasing units. To be specific, when one physical erasing unit is selected from the spare area 414 for storing valid data, this physical erasing unit is associated to the data area 412. In addition, the memory controller 104 (or the memory management circuit 202) executes an erasing operation on the physical erasing units of the data area 412, which only store invalid data, and associates these physical erasing units to the spare area 414 after the erasing operation, such that the physical erasing units can be alternately used to store the data written by the host system 1000.

The physical erasing units logically belonging to the system area 404 are used for recording the system data, which includes information related to the manufacturer and model number of the memory chip, the number of physical erasing units in the memory chip, the number of physical programming units in each physical erasing unit, and so forth.

The physical erasing units logically belonging to the substitute area 406 are substitute physical erasing units. For example, when the rewritable non-volatile memory module 106 is manufactured in the factory, 4% of the physical erasing units therein are reserved for substitution. Namely, when any physical erasing unit in the data area 412, the spare area 414, or the system area 404 is damaged, the physical erasing unit reserved in the substitute area 406 is used to substitute the damaged physical erasing unit (i.e. bad block). Thus, in the case that there are functional physical erasing units available in the substitute area 406 and a physical erasing unit is damaged, the memory controller 104 extracts one functional physical erasing unit from the substitute area 406 to substitute the damaged one. If there is no functional physical erasing unit available in the substitute area 406 and a physical erasing unit is damaged, the memory controller 104 announces the whole memory storage apparatus 100 as being in a write protect state and data can no longer be written thereto.

Particularly, the numbers of the physical erasing units respectively in the storage area 402, the system area 404, and the substitute area 406 may differ from one another depending on different memory specifications. In addition, it should be understood that, during the operation of the memory storage apparatus 100, the grouping relationship between the physical erasing units that are associated respectively to the storage area 402, the system area 404, and the substitute area 406 varies dynamically. For example, if one physical erasing unit of the storage area 402 is damaged and substituted by the physical erasing unit of the substitute area 406, this physical erasing unit of the substitute area 406 is associated with the storage area 402.

With reference to FIG. 13, as described above, the physical erasing units of the data area 412 and the spare area 414 store the data written by the host system 1000 in an alternate way. In this exemplary embodiment, the memory controller 104 (or the memory management circuit 202) allocates logical addresses LBA(0)-LBA(H) for the host system 1000 to perform data accessing.

Each logical address is constituted by several sectors. In this exemplary embodiment, each of the logical addresses is constituted by four sectors, for example. For instance, sectors LSA(0)-LSA(3) belong to the logical address LBA(0); sectors LSA(4)-LSA(7) belong to the logical address LBA(1); sectors LSA(8)-LSA(11) belong to the logical address LBA(2); and so forth. Nevertheless, the invention is not limited thereto. In another exemplary embodiment of the present invention, the logical address may be constituted by 8 or 16 sectors.

For example, the memory controller 104 (or the memory management circuit 202) maintains a logical address to physical address mapping table to record a mapping relationship between the logical addresses and the physical programming units. Namely, when the host system 1000 accesses data in one sector, the memory controller 104 (or the memory management circuit 202) determines the logical address, to which the sector belongs, and accesses data in the physical programming unit mapping to the logical address.

For example, when the memory controller 104 (or the memory management circuit 202) starts using the physical erasing unit 304(0) to store the data written by the host system 1000, the memory controller 104 (or the memory management circuit 202) writes the data in sequence into the physical programming units of the physical erasing unit 304(0) regardless of the logical address to which the host system 1000 writes the data; and when the memory controller 104 (or the memory management circuit 202) starts using the physical erasing unit 304(1) to store the data written by the host system 1000, the memory controller 104 (or the memory management circuit 202) writes the data into the physical programming units of the physical erasing unit 304(1) regardless of the logical address to which the host system 1000 writes the data. That is to say, the memory controller 104 (or the memory management circuit 202) sequentially uses the physical programming units in one physical erasing unit for writing the data that the host system 1000 intends to write, and selects another empty physical erasing unit (i.e. extracting one physical erasing unit from the spare area 414) and continues writing the data sequentially in the physical programming units of the new selected physical erasing unit only after all the physical programming units in the previous physical erasing unit are used up. In this exemplary embodiment, the memory controller 104 (or the memory management circuit 202) updates the logical address to physical address mapping table to correctly record the mapping relationship between the logical addresses and the physical programming units after writing the data into the physical programming units.

FIG. 14 illustrates an example of a logical address to physical programming unit mapping table according to the first exemplary embodiment.

Referring to FIG. 14, a logical address to physical address mapping table 800 includes a logical address column 802 and a physical address column 804. The logical address column 802 records a number of each allocated logical address and the physical address column 804 records the physical programming unit mapping to each logical address. When the memory storage apparatus 100 is brand-new and has not been used for storing any data, the physical erasing units 304(0)-304(N) are associated to the spare area 414, and a field for recording the physical programming unit corresponding to each logical address in the logical address to physical address mapping table 800 is marked as a null value (e.g. NULL).

FIG. 15 is a schematic diagram illustrating a physical programming unit according to the first exemplary embodiment. The physical erasing unit 304(0) is exemplified hereinafter, and the structures of the other physical erasing units may be derived therefrom.

With reference to FIG. 15, the physical erasing unit 304(0) includes physical programming units PBA(0-0)-PBA(0-K). In this exemplary embodiment, K is an even integer, for example. For instance, K is 256. The physical programming units PBA(0-0) and PBA(0-2) are constituted by the memory cells on the word line W(0); the physical programming units PBA(0-1) and PBA(0-4) are constituted by the memory cells on the word line W(1); the physical programming units PBA(0-3) and PBA(0-6) are constituted by the memory cells on the word line W(2); the physical programming units PBA(0-5) and PBA(0-8) are constituted by the memory cells on the word line W(3); and accordingly, the physical programming units PBA(0-(K-4)) and PBA(0-(K-1)) are constituted by the memory cells on the word line W(L-2); and the physical programming units PBA(0-(K-2)) and PBA(0-K) are constituted by the memory cells on the word line W(L-1). Here, the physical programming units PBA(0-0), PBA(0-1), PBA(0-3), PBA(0-5), . . . , PBA(0-(K-4)), and PBA(0-(K-2)) are lower physical programming units; and the physical programming units PBA(0-2), PAB (0-4), PBA(0-6), PBA(0-8), . . . , PBA(0-(K-1)), and PBA (0-K) are upper physical programming units.

It should be understood that, in another exemplary embodiment of the invention, the rewritable non-volatile memory module 106 may also be a TLC NAND flash memory module or other MLC flash memory chips. For instance, the rewritable non-volatile memory module 106 is a TLC NAND flash memory module, and the physical programming units of each physical erasing unit can be categorized respectively as lower physical programming units (also called high-speed physical programming units), middle physical programming units (also called middle-speed physical programming units), and upper physical programming units (also called low-speed physical programming units) according the accessing speeds thereof.

In this exemplary embodiment, the memory controller 104 (or the memory management circuit 202) divides data into a plurality of information frames in the unit of one physical programming unit when writing the data into the physical erasing unit. The memory controller 104 (or the memory management circuit 202) first programs a portion of the information frames sequentially into the physical erasing unit to fill the lower physical programming units of the physical erasing unit and then programs the rest of the information frames sequentially into the upper physical programming units of the physical erasing unit.

Figure 16:
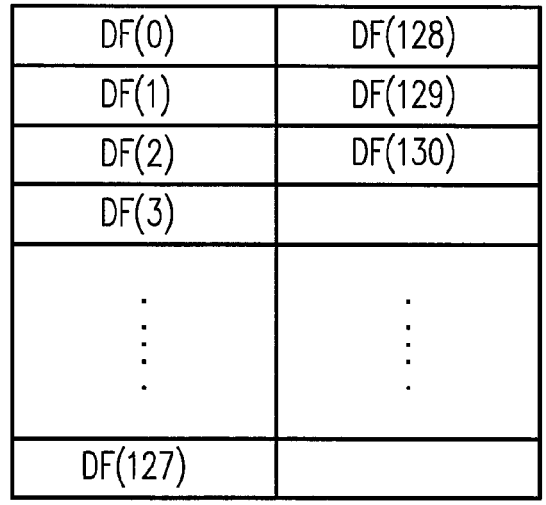
FIG. 16 is a schematic diagram illustrating writing data into a physical erasing unit according to an exemplary embodiment.

FIG. 16 is a schematic diagram illustrating writing data into a physical erasing unit according to an exemplary embodiment. To make the embodiment easily understandable, below each of the physical erasing units is exemplified as being constituted by 256 physical programming units, i.e. K is 256 in FIG. 15.

With reference to FIG. 16, if the host system 1000 instructs to write data to the logical addresses LBA(0)-LBA (130) when the rewritable non-volatile memory module 106 is in a state of storing no data therein, the memory controller 104 (or the memory management circuit 202) organizes the data into information frames DF(0)-DF(130) in sequence that respectively correspond to the logical addresses LBA (0)-LBA(130) according to the sizes of the physical programming units (e.g. 8 kilobytes (KB)), and selects the physical erasing unit 304(0) for writing the information frames DF(0)-DF(130). More specifically, the memory controller 104 (or the memory management circuit 202) first programs the information frames DF(0)-DF(127) in sequence to the lower physical programming units PBA(0-0), PBA(0-1), PBA(0-3), PBA(0-5), . . . , PBA(0-(253)), and PBA(0-(251)) of the physical erasing unit 304(0), and then programs the information frames DF(128)-DF(130) to the upper physical programming units PBA(0-2), PBA(0-4), and PBA(0-6). Thereafter, the memory controller 104 (or the memory management circuit 202) updates the logical address to physical address mapping table 800 to record the mapping relationship between the logical addresses LBA (0)-LBA(130) and the physical programming units PBA(0-0), PBA(0-1), PBA(0-3), PBA(0-5), PBA(0-(253)), PBA(0-(251)), PB A(0-2), PBA(0-4), and PBA(0-6).

In a case where the physical erasing unit 304(0) is "not" fully written with data (as shown in FIG. 16), because the upper and lower physical programming units on the same word line are both programmed or the upper physical programming unit is not programmed while the lower physical programming unit on the same word line is programmed, there is no such a situation that one word line with the upper and lower physical programming units both programmed is adjacent to the word line with unprogrammed upper and lower physical programming units. Therefore, the possibility of data loss due to margin electric leakage, which occurs when the rewritable non-volatile memory module 106 is under high temperature, is reduced.

Figure 17:
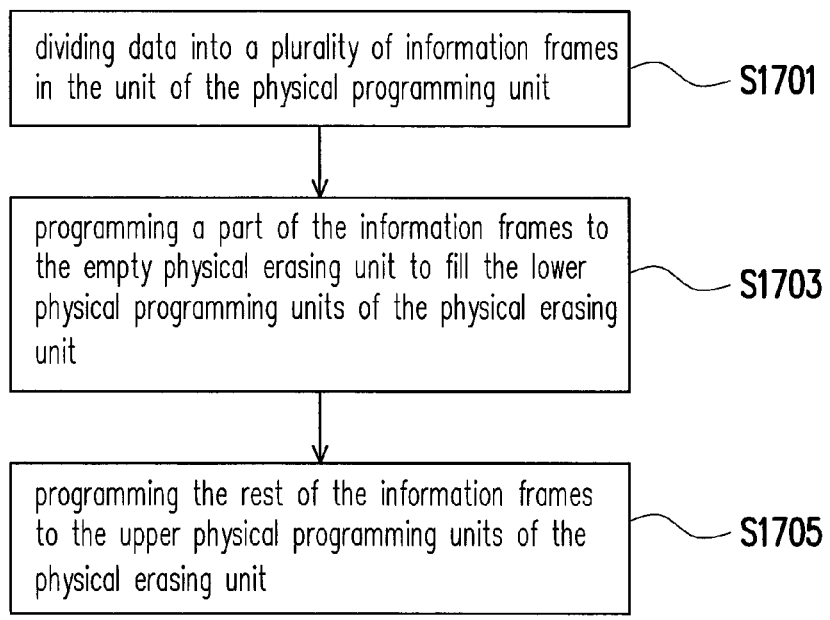
FIG. 17 is a flowchart illustrating a data writing method according to the first exemplary embodiment.

FIG. 17 is a flowchart illustrating a data writing method according to the first exemplary embodiment.

Referring to FIG. 17, when writing data, which is insufficient to fill one physical erasing unit, into the rewritable non-volatile memory module 106, the data is divided into a plurality of information frames in a unit of the physical programming unit in Step S1701. It should be noted that, because the size of the data that is to be written is less than the volume of one physical erasing unit, the number of the information frames obtained in Step S1701 is smaller than the number of the physical programming units of one physical erasing unit.

In Step S1703, a portion of the information frames is programmed to the empty physical erasing unit to fill the lower physical programming units of the physical erasing unit. Then, in Step S1705, the rest of the information frames is programmed to the upper physical programming units of the physical erasing unit.

Second Exemplary Embodiment

The structure of a memory storage apparatus of the second exemplary embodiment is similar to the structure of the memory storage apparatus of the first exemplary embodiment. A difference lies in that, according to the second exemplary embodiment, the memory controller (or memory management circuit) programs the information frames to the physical erasing unit according to an order that the physical programming units PBA(0-0), PBA(0-1), PBA (0-2), PBA(0-3), . . . , PBA(0-(K-2)), PBA(0-(K-1)), and PBA(0-(K)) are arranged. And, after writing the last information frame, the memory controller (or memory management circuit) further programs the memory cells on the following word line to an auxiliary pattern, so as to prevent the valid data stored in the physical erasing unit, which is not full of data, from being lost due to electric leakage. Hereinafter, reference numerals of the first exemplary embodiment are used for describing the difference between the first exemplary embodiment and the second exemplary embodiment.

Figure 18:
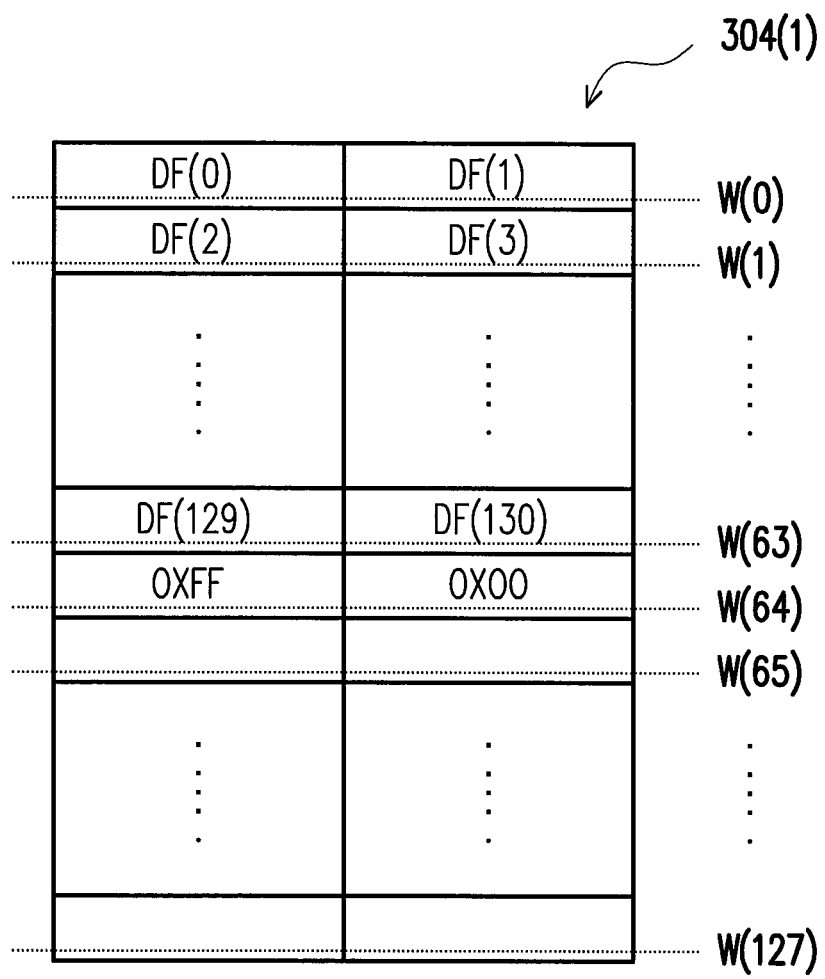
FIG. 18 is a schematic diagram illustrating writing data into a physical erasing unit according to an exemplary embodiment.

FIG. 18 is a schematic diagram illustrating writing data into a physical erasing unit according to an exemplary embodiment. To make the embodiment easily understandable, below each of the physical erasing units is exemplified as being constituted by 256 physical programming units, i.e. K is 256 in FIG. 15.

With reference to FIG. 18, provided that the rewritable non-volatile memory module 106 has been formatted to the state as shown in FIG. 8 and the host system 1000 instructs to write data to the logical addresses LBA(0)-LBA(130), the memory controller 104 (or the memory management circuit

202) organizes the data in sequence into information frames DF(0)-DF(130) that correspond to the logical addresses LBA(0)-LBA(130) in the unit of one physical programming unit (e.g. 8 kilobytes (KB)) and selects the physical erasing unit 304(0) for writing the information frames DF(0)-DF(130). More specifically, the memory controller 104 (or the memory management circuit 202) programs the information frames DF(0)-DF(130) in sequence to the lower and upper physical programming units PBA(0-0), PBA(0-1), PBA(0-2), PBA(0-3), PBA(0-4), PBA(0-5), . . . , PBA(0-129), and PBA(0-130) of the physical erasing unit 304(0) and programs the memory cells on the word line W(64) of the physical erasing unit 304(0) to the second storage state (i.e. "10"). That is, the lower physical programming unit, constituted by the memory cells on the word line W64, is written with data 0xFF having each bit being "1"; and the upper physical programming unit, constituted by the memory cells on the word line W(64), is written with data 0x00 having each bit being "0". In another exemplary embodiment, the lower physical programming unit, constituted by the memory cells on the word line W(64), may be written with data 0x00 having each bit being "1" while the upper physical programming unit, constituted by the memory cells on the word line W(64), may be written with data 0x00 having each bit being "0", or the lower physical programming unit, constituted by the memory cells on the word line W(64), may be written with data 0x00 having each bit being "1" while the upper physical programming unit, constituted by the memory cells on the word line W(64), may be written with data 0xFF having each bit being "0". Namely, a pattern of the data stored in the memory cells on the word line W(64) is changed to a different pattern after erasion.

In an example that the physical erasing unit 304(0) is not fully written with data (as shown in FIG. 18), because the memory cells, which are adjacent to the memory cells having valid information frames stored therein, have been programmed to a non-erasing state, the stored data is not easily lost due to margin electric leakage even if the rewritable non-volatile memory module 106 is under high temperature.

It should be understood that, although this exemplary embodiment programs the memory cells, which are adjacent to the memory cells having valid information frames stored therein, to the second storage state to prevent electric leakage caused by high temperature, the present invention is not limited thereto. In another exemplary embodiment, the memory cells, which are adjacent to the memory cells having valid information frames stored therein, may be programmed to the third storage state. That is to say, in this exemplary embodiment, the memory cells, which are adjacent to the memory cells having valid information frames stored therein, are programmed to a middle storage state (i.e. the gate voltage of the memory cell is not at the highest or the lowest state), so as to prevent data loss due to high temperature. Furthermore, in another exemplary embodiment, the storage state to be programmed to the corresponding memory cells on the following word line may be determined according to the last information frame. Take a TLC NAND flash memory module as an example, if the storage state of the memory cell that stores the last information frame is the first storage state, the corresponding memory cells on the following word line are programmed to the first storage state; if the storage state of the memory cell that stores the last information frame is the second storage state, the corresponding memory cells on the following word line are programmed to the first or the second storage state; if the storage state of the memory cell that stores the last information frame is the third storage state, the corresponding memory cells on the following word line are programmed to the second storage state; if the storage state of the memory cell that stores the last information frame is the fourth storage state, the corresponding memory cells on the following word line are programmed to the second or the third storage state; if the storage state of the memory cell that stores the last information frame is the fifth storage state, the corresponding memory cells on the following word line are programmed to the third storage state; if the storage state of the memory cell that stores the last information frame is the sixth storage state, the corresponding memory cells on the following word line are programmed to the third or the fourth storage state; if the storage state of the memory cell that stores the last information frame is the seventh storage state, the corresponding memory cells on the following word line are programmed to the fourth storage state; and if the storage state of the memory cell that stores the last information frame is the eighth storage state, the corresponding memory cells on the following word line are programmed to the fourth or the fifth storage state. Namely, due to the programming of this memory cell, the potential of the storage state of the corresponding memory cells on the following word line is changed to a middle value between the first storage state (or erasing state) and the storage state of the memory cell that stores the last information frame, or changed to a value not greater than the middle value, such that the variance in potential between the memory cell, which stores valid information frames therein, and the memory cell, which is in an erasing state, in the same physical erasing unit does not become too large, so as to reduce the probability of losing electrons of the charge-trapping layer due to abnormal operations.

It should be noted that, in this exemplary embodiment, only the memory cell on the word line following the last word line, to which the write bias voltage is applied, is programmed to the second storage state during the process of programming the information frame to the physical programming unit. However, the present invention is not limited thereto. In another exemplary embodiment, the memory controller 104 (or the memory management circuit 202) may program the memory cells on a predetermined number of word lines following the last word line, to which the write bias voltage is applied, to the middle storage state, or program all memory cells, which have no information frame written therein, in the physical erasing unit to the middle storage state, during the process of programming the information frame to the physical programming unit. In particular, in this exemplary embodiment, the word "adjacent" means "being close to" or "abutting on" in terms of physical space or physical address.

Further, in this exemplary embodiment, the memory cell on at least one word line adjacent to the word line corresponding to the memory cell, to which the information frame is written, is programmed to the middle storage state, so as to reduce the potential difference between the memory cell, which has valid information frame stored therein, and the memory cell, which has no information frame written therein, thereby preventing electric leakage due to high temperature. Nevertheless, the present invention is not limited thereto. In another exemplary embodiment, the memory controller 104 (or the memory management circuit 202) may program the memory cell on at least one word line adjacent to the word line corresponding to the memory cell, to which the information frame is written, to the same storage state as the memory cell on the last word line, to which the write bias voltage is applied, during the process of programming the information frame to the physical programming unit.

It should be understood that the rewritable non-volatile memory module 106 is exemplified as a MLC NAND in the second exemplary embodiment. However, the present invention is not limited thereto. In an example where the rewritable non-volatile memory module 106 is a SLC flash memory module, the effect of preventing data loss can also be achieved by programming the following word line, to which valid data is written, to the aforementioned predefined storage state.

Figure 19:
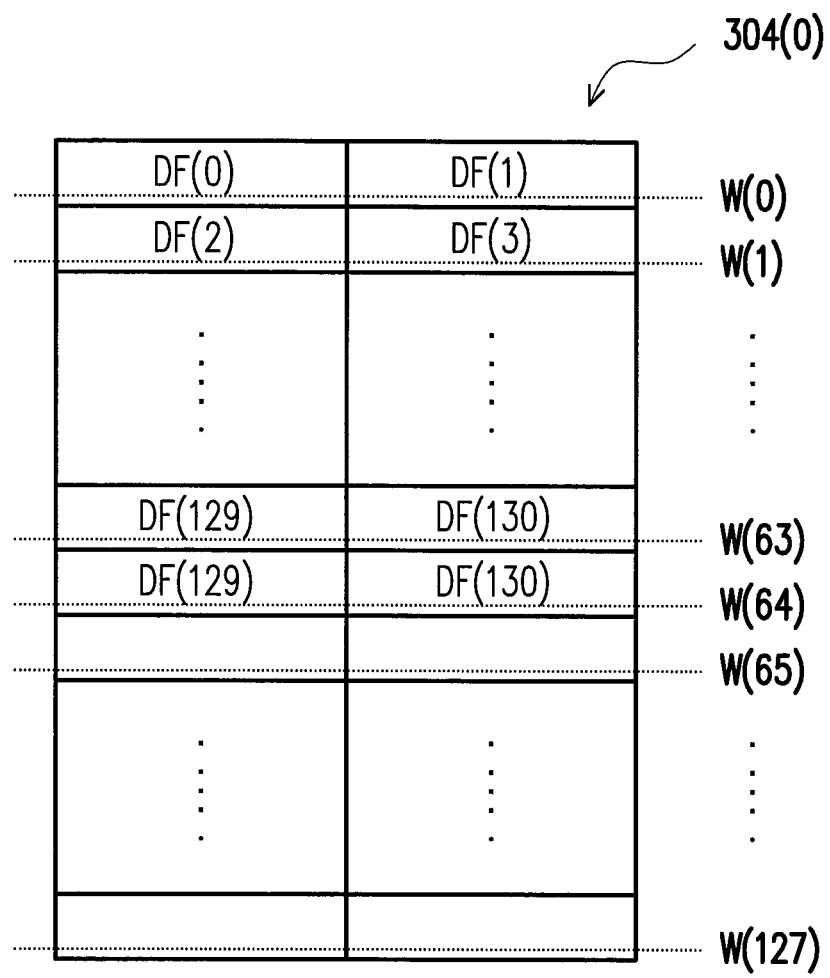
FIG. 19 is a schematic diagram illustrating writing data into a physical erasing unit according to another exemplary embodiment.

FIG. 19 is a schematic diagram illustrating writing data into a physical erasing unit according to another exemplary embodiment. To make the embodiment easily understandable, below each of the physical erasing units is exemplified as being constituted by 256 physical programming units, i.e. K is 256 in FIG. 15.

With reference to FIG. 19, provided that the rewritable non-volatile memory module 106 is formatted to the state of FIG. 8 and the host system 1000 instructs to write data into the logical addresses LBA(0)-LBA(130), the memory controller 104 (or the memory management circuit 202) organizes the data in sequence into information frames DF(0)-DF(130) that correspond to the logical addresses LBA(0)-LBA(130) in the unit of one physical programming unit (e.g. 8 kilobytes (KB)) and selects the physical erasing unit 304(0) for writing the information frames DF(0)-DF(130). More specifically, the memory controller 104 (or the memory management circuit 202) programs the information frames DF(0)-DF(130) in sequence to the lower and upper physical programming units PBA(0-0), PBA(0-1), PBA(0-2), PBA(0-3), PBA(0-4) PBA(0-5), . . . PBA(0-129), and PBA(0-130) of the physical erasing unit 304(0) and then programs the memory cells on the word line W(64) of the physical erasing unit 304(0) to the same storage state as the memory cells on the word line W(63). In other words, the information frames DF(129) and DF(130) are repetitively written to the lower physical programming unit PBA(0-131) and the upper physical programming unit PBA(0-132), constituted by the memory cells on the word line W(64). Based on the above, because the memory cell adjacent to the memory cell having valid information frame stored therein has been programmed, the stored data is not lost even if the rewritable non-volatile memory module 106 is under high temperature.

It should be understood that, although the exemplary embodiment of FIG. 19 illustrates programming the memory cell on the word line W(64) of the physical erasing unit 304(0) to the same storage state as the memory cell on the word line W(63), the present invention is not limited thereto. In another exemplary embodiment, the memory controller 104 (or the memory management circuit 202) may program the memory cell on the word line W(64) to be the same as the storage state of the memory cells on other word lines (e.g. word lines W(0)-W(62)). Additionally, in an exemplary embodiment, the memory controller 104 (or the memory management circuit 202) may program all the memory cells, to which no information frame is written, in the physical erasing unit to be the same as the storage state of the memory cell on the word line W(63).

Figure 20:
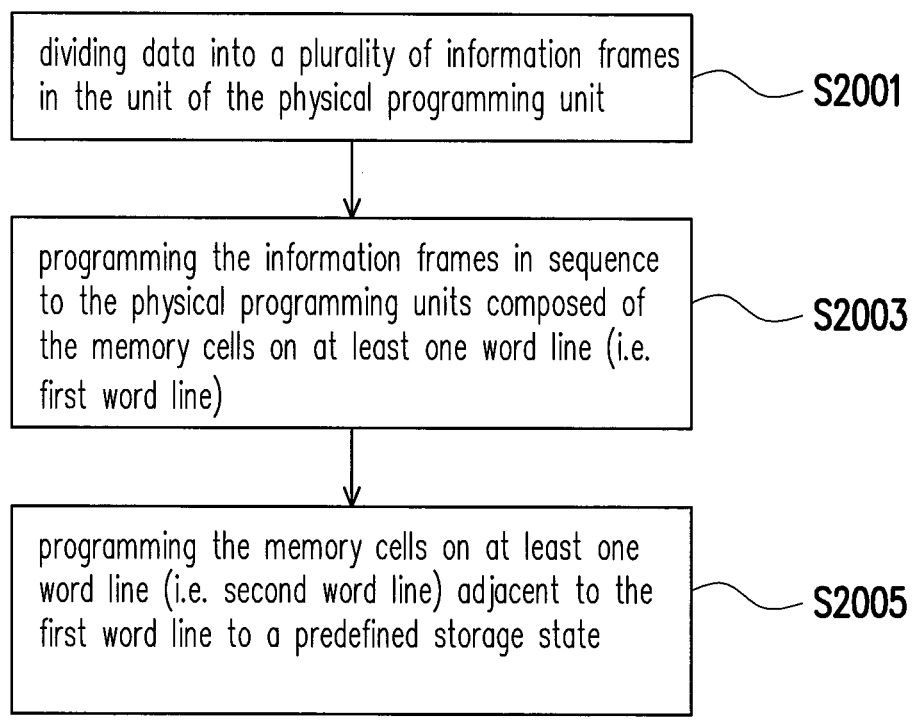
FIG. 20 is a flowchart illustrating a data writing method according to the second exemplary embodiment.

FIG. 20 is a flowchart illustrating a data writing method according to the second exemplary embodiment.

Referring to FIG. 20, when writing data, which is insufficient to fill one physical erasing unit, into the rewritable non-volatile memory module 106, the data is divided into a plurality of information frames in a unit of the physical programming unit in Step S2001. It should be noted that, because the size of the data that is to be written is less than the volume of one physical erasing unit, the number of the information frames obtained in Step S2001 is smaller than the number of the physical programming units of one physical erasing unit.

In Step S2003, the information frames are programmed in sequence to the physical programming units constituted by the memory cells on at least one word line (referred to as first word line hereinafter). Thereafter, in Step S2005, the memory cells on at least one word line (referred to as second word line hereinafter) adjacent to the first word lines are programmed to an auxiliary pattern. As described above, the memory cells on the second word line are programmed to the middle storage state or to the same storage state as the last word line among the first word lines.

In conclusion of the above, the data writing method, the memory controller, and the memory storage apparatus in the exemplary embodiments of the invention effectively prevent the data stored in one physical erasing unit, which is not full of data, from being lost. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data writing method, for writing data into a physical erasing unit comprising a plurality of memory cells, a plurality of word lines, and a plurality of bit lines, wherein each of the memory cells electrically connected to one of the word lines and one of the bit lines, the memory cells constitute a plurality of physical programming units comprising a plurality of lower physical programming units and a plurality of upper physical programming units, and a speed of writing data into the lower physical programming units is higher than a speed of writing data into the upper physical programming units, the data writing method comprising:

dividing the data into a plurality of information frames in a unit of one physical programming unit, wherein the number of the information frames is smaller than the number of the physical programming units of the physical erasing unit; and executing a first programming operation or a second programming operation to program the information frames into the memory cells connected to at least one first word line, wherein the first programming operation programs the information frames into the memory cells connected to the at least one first word line by filling the lower physical programming units with the information frames and then writing the rest of the information frames to the upper physical programming units, wherein the second programming operation programs the information frames into the lower and upper physical programming units of the memory cells connected to the at least one first word line sequentially and then programs an auxiliary pattern into the memory cells connected to at least one second word line, wherein the auxiliary pattern is invalid data, wherein, in the second programming operation, the at least one second word line is adjacent to the at least one first word line, the at least one first word line is not adjacent to a third word line, and a storage state of the memory cells on the third word line is an erasing state.

2. The data writing method according to claim 1, wherein a storage state of each of the memory cells is available to be interpreted as a first storage state, a second storage state, a third storage state, or a fourth storage state, wherein a verification voltage corresponding to the first storage state is lower than a verification voltage corresponding to the second storage state, the verification voltage corresponding to the second storage state is lower than a verification voltage corresponding to the third storage state, and the verification voltage corresponding to the third storage state is lower than a verification voltage corresponding to the fourth storage state,
 wherein, in the second programming operation, writing the information frames in sequence into at least one physical programming unit constituted by the memory cells on the at least one first word line; and programming the memory cells on the at least one second word line to the second storage state or the third storage state.

3. The data writing method according to claim 1, wherein in the second programming mode, setting the auxiliary pattern according to the storage state of the memory cells on the at least one first word line; and programming the auxiliary pattern into the memory cells on at least one second word line.

4. The data writing method according to claim 3, wherein in the second programming operation, programming the memory cells on the at least one second word line to the same storage state as the memory cells on the last word line among the at least one first word line.

5. The data writing method according to claim 1, wherein, in the first programming operation, the step of filling the lower physical programming units with the information frames and then writing the rest of the information frames to the upper physical programming units comprises:
 writing a portion of the information frames into the physical erasing unit to fill the lower physical programming units; and
 writing the rest of the information frames to the upper physical programming units of the physical erasing unit after the lower physical programming units are filled.

6. The data writing method according to claim 1, wherein in the second programming operation, programming a random value to the memory cells on the at least one second word line as the auxiliary pattern.

7. The data writing method according to claim 6, wherein, in the second programming operation, a potential of the storage state of each memory cell on the at least one second word line is not greater than a potential of the storage state of the corresponding memory cell on the at least one first word line.

8. The data writing method according to claim 6, wherein, in the second programming operation, a potential of the storage state of each memory cell on the at least one second word line is not greater than a middle value between a potential of the first storage state and a potential of the storage state of the corresponding memory cell on the at least one first word line.

9. A memory controller for controlling a rewritable non-volatile memory module, the memory controller comprising:
 a host interface configured to be coupled to a host system;
 a memory interface configured to be coupled to the rewritable non-volatile memory module; and
 a memory management circuit coupled to the host interface and the memory interface and configured to write data into a physical erasing unit of the rewritable non-volatile memory module, wherein the physical erasing unit comprises a plurality of memory cells, a plurality of word lines, and a plurality of bit lines, each of the memory cells is electrically connected to one of the word lines and one of the bit lines, the memory cells constitute a plurality of physical programming units comprising a plurality of lower physical programming units and a plurality of upper physical programming units, and a speed of writing data is written into the lower physical programming units is higher than a speed of writing data into the upper physical programming units,
 wherein the memory management circuit divides the data into a plurality of information frames in a unit of one physical programming unit, and the number of the information frames is smaller than the number of the physical programming units of the physical erasing unit,
 wherein the memory management circuit executes a first programming operation or a second programming operation to program the information frames into the memory cells connected to at least one first word line,
 wherein the first programming operation programs the information frames into the memory cells connected to the at least one first word line by filling the lower physical programming units with the information frames and then writing the rest of the information frames to the upper physical programming units,
 wherein the second programming operation programs the information frames into the lower and upper physical programming units of the memory cells connected to the at least one first word line sequentially and then programs an auxiliary pattern into the memory cells connected to at least one second word line, wherein the auxiliary pattern is invalid data,
 wherein, in the second programming operation, the at least one second word line is adjacent to the at least one first word line storing a portion of the information frames, the at least one first word line is not adjacent to a third word line, and a storage state of the memory cells on the third word line is an erasing state.

10. The memory controller according to claim 9, wherein a storage state of each of the memory cells is available to be interpreted as a first storage state, a second storage state, a third storage state, or a fourth storage state, wherein a verification voltage corresponding to the first storage state is lower than a verification voltage corresponding to the second storage state, the verification voltage corresponding to the second storage state is lower than a verification voltage corresponding to the third storage state, and the verification voltage corresponding to the third storage state is lower than a verification voltage corresponding to the fourth storage state,
 wherein, in the second programming operation, the memory management circuit writes the information frames in sequence into at least one physical programming unit constituted by the memory cells on the at least one first word line, and programs the memory cells on the at least one second word line to the second storage state or the third storage state.

11. The memory controller according to claim 9, wherein, in the second programming mode, the memory management circuit sets the auxiliary pattern according to the storage state of the memory cells on the at least one first word line.

12. The memory controller according to claim 11, wherein, in the second programming operation, the auxiliary pattern is the same as the storage state of the memory cells on the last word line among the at least one first word line.

13. The memory controller according to claim 9, wherein, in the first programming operation, the memory management circuit writes a portion of the information frames into the physical erasing unit to fill the lower physical programming units; and writes the rest of the information frames to the upper physical programming units of the physical erasing unit after the lower physical programming units are filled.

14. The memory controller according to claim 9, in the second programming operation, the memory management circuit programs a random value to the memory cells on the at least one second word line as the auxiliary pattern.

15. The memory controller according to claim 9, wherein, in the second programming operation, a potential of the storage state of each memory cell on the at least one second word line is not greater than a potential of the storage state of the corresponding memory cell on the at least one first word line.

16. The memory controller according to claim 9, wherein, in the second programming operation, a potential of the storage state of each memory cell on the at least one second word line is not greater than a middle value between a potential of the first storage state and a potential of the storage state of the corresponding memory cell on the at least one first word line.

17. A memory storage apparatus, comprising:
a connector configured to be coupled to a host system;
a rewritable non-volatile memory module; and
a memory controller coupled to the connector and the rewritable non-volatile memory module and configured to write data into a physical erasing unit of the rewritable non-volatile memory module, wherein the physical erasing unit comprises a plurality of memory cells, a plurality of word lines, and a plurality of bit lines, each of the memory cells is electrically connected to one of the word lines and one of the bit lines, the memory cells constitute a plurality of physical programming units comprising a plurality of lower physical programming units and a plurality of upper physical programming units, and a speed of writing data into the lower physical programming units is higher than a speed of writing data into the upper physical programming units,
wherein the memory controller divides the data into a plurality of information frames in a unit of one physical programming unit, and the number of the information frames is smaller than the number of the physical programming units of the physical erasing unit,
wherein the memory controller executes a first programming operation or a second programming operation to write the information frames in sequence into at least one physical programming unit constituted by the memory cells on at least one first word line among the words line of the physical erasing unit,
wherein, in the first programming operation, the memory controller fills the lower physical programming units with the information frames and then writes the rest of the information frames to the upper physical programming units,
wherein, in the second programming operation, the memory controller programs the information frames into the lower and upper physical programming units of the memory cells connected to the at least one first word line sequentially and then programs an auxiliary pattern into the memory cells connected to at least one second word line, wherein the auxiliary pattern is invalid data, the at least one second word line is adjacent to the at least one first word line storing a portion of the information frames, the at least one first word line is not adjacent to a third word line, and a storage state of the memory cells on the third word line is an erasing state.

18. The memory storage apparatus according to claim 17, wherein a storage state of each of the memory cells is available to be interpreted as a first storage state, a second storage state, a third storage state, or a fourth storage state, wherein a verification voltage corresponding to the first storage state is lower than a verification voltage corresponding to the second storage state, the verification voltage corresponding to the second storage state is lower than a verification voltage corresponding to the third storage state, and the verification voltage corresponding to the third storage state is lower than a verification voltage corresponding to the fourth storage state,
wherein, in the second programming operation, the memory controller writes the information frames in sequence into at least one physical programming unit constituted by the memory cells on the at least one first word line, and programs the memory cells on the at least one second word line to the second storage state or the third storage state.

19. The memory storage apparatus according to claim 17, wherein, in the second programming mode, the memory controller sets the auxiliary pattern according to the storage state of the memory cells on the at least one first word line.

20. The memory storage apparatus according to claim 19, wherein, in the second programming mode, the auxiliary pattern is the same as the storage state of the memory cells on the last word line among the at least one first word line.

21. The memory storage apparatus according to claim 17, wherein, in the first programming operation, the memory controller writes a portion of the information frames into the physical erasing unit to fill the lower physical programming units; and writes the rest of the information frames to the upper physical programming units of the physical erasing unit after the lower physical programming units are filled.

22. The memory storage apparatus according to claim 17, in the second programming operation, the memory controller programs a random value to the memory cells on the at least one second word line as the auxiliary pattern.

23. The memory storage apparatus according to claim 17, wherein, in the second programming operation, a potential of the storage state of each memory cell on the at least one second word line is not greater than a potential of the storage state of the corresponding memory cell on the at least one first word line.

24. The memory storage apparatus according to claim 17, wherein, in the second programming operation, the potential of the storage state of each memory cell on the at least one second word line is not greater than a middle value between a potential of the first storage state and the potential of the storage state of the corresponding memory cell on the at least one first word line.

* * * * *